United States Patent [19]

De Burgat et al.

[11] Patent Number: 4,683,417
[45] Date of Patent: Jul. 28, 1987

[54] METHOD AND APPARATUS FOR RAPIDLY TESTING CAPACITORS AND DIELECTRIC MATERIALS

[75] Inventors: Michel De Burgat, Rennes; André Le Traon, Cesson Sevigne; Jean-Claude Pilet; Ammar Sharaiha, both of Rennes, all of France

[73] Assignee: Universite de Rennes I, Rennes, France

[21] Appl. No.: 733,149

[22] Filed: May 10, 1985

[30] Foreign Application Priority Data

May 10, 1984 [FR] France ................. 84 07196

[51] Int. Cl.$^4$ ............ G01R 27/26; G01R 11/52
[52] U.S. Cl. .................... 324/60 C; 324/60 CD; 324/57 PS
[58] Field of Search .......... 324/51, 60 C, 60 CD, 324/57 R, 57 PS

[56] References Cited

U.S. PATENT DOCUMENTS

| | | | |
|---|---|---|---|
| 3,824,459 | 7/1974 | Uchida | 324/60 CD |
| 4,216,424 | 8/1980 | Vette | 324/60 C |
| 4,282,480 | 8/1981 | Fujito | 324/60 CD |
| 4,404,481 | 9/1983 | Ide | 324/60 CD |
| 4,558,274 | 12/1985 | Carusillo | 324/60 CD |

OTHER PUBLICATIONS

Popkirov: "A method for the Measurement of Capacitance . . . ", J. Phys. E: Sci. Instrum–vol. 14, 1981–No. 9–Sep. 1981.
Hagiwara: "Digital Capacitance Meter . . . "–Memoirs Defence Academy of Japan–Jan. 1978–pp. 71–78.
McCreary: "Precision Capacitor Ratio Measurement . . . ", IEEE Trans. Instr. & Meas.–Mar. 79–pp. 11–17.

Primary Examiner—Reinhard J. Eisenzopf
Assistant Examiner—Jose M. Solis
Attorney, Agent, or Firm—Becker & Becker, Inc.

[57] ABSTRACT

The apparatus comprises a measuring unit (300) which receives a component to be tested (Cx) in series with a reference impedance in a measuring chain, a clock (100) suitable for applying repetitive stimulating pulses to the measuring chain, means for resetting the voltage at the terminals of the reference impedance to zero during each inactive half-cycle of the stimulating pulses, sampling means (400) which sample the response at instants which are progressively shifted relative to the stimulating pulses, and a processing unit (200) which analyzes the samples taken by the sampling unit to deduce the parameters of the tested item using a Foster model.

37 Claims, 17 Drawing Figures

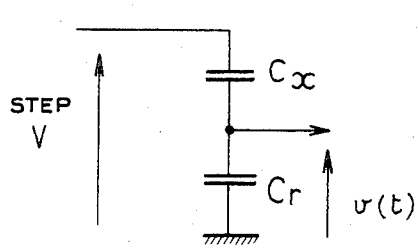
FIG_2
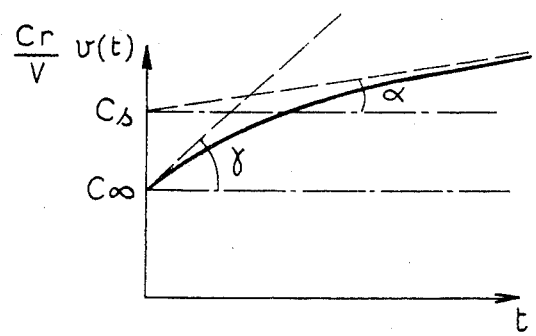
FIG_3
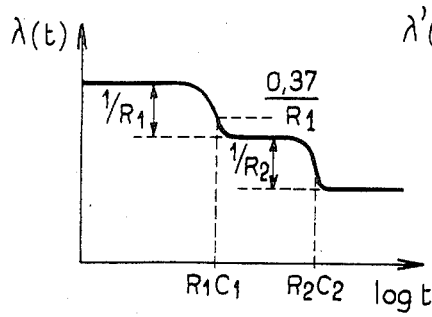
FIG_4
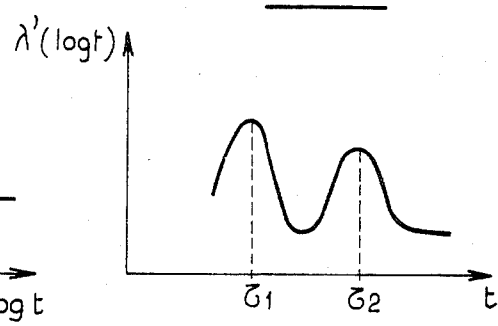
FIG_5
FIG_6a TEST CYCLE
| | 1ST BURST | 2ND BURST | |
|---|---|---|---|
| | • 500 STIMULATING PULSES WITH A PERIOD OF 200μs<br>• SAMPLING AT 200.2 μs | • 10 STIMULATING PULSES WITH A PERIOD OF 2 ms<br>• SAMPLING AT 202 μs | • 1 PULSE OF 800 ms DURATION<br>• REAL-TIME SAMPLING |
FIG_6b  1ST BURST
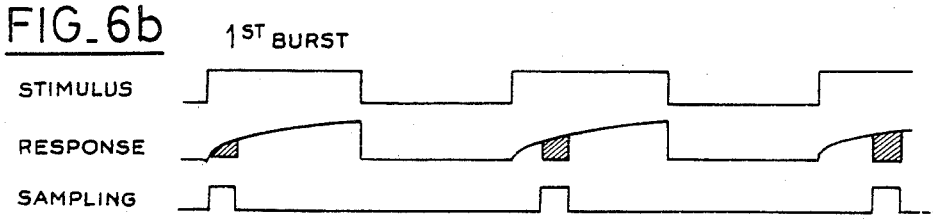
FIG_6c  2ND BURST
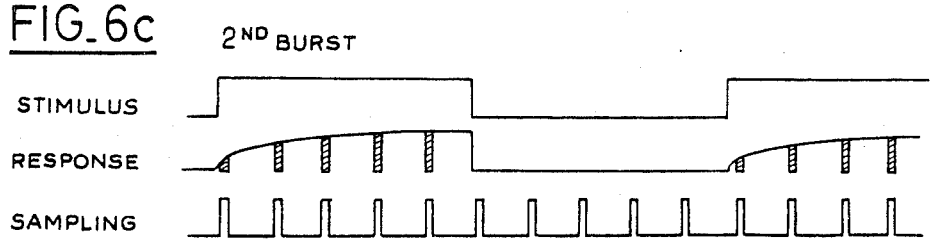

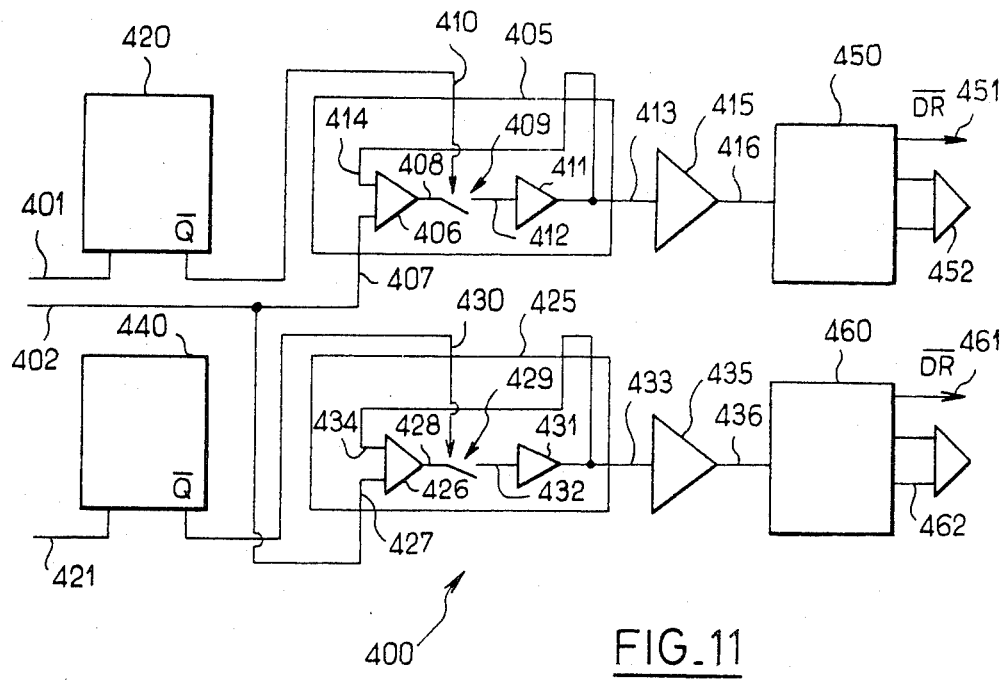
FIG_11
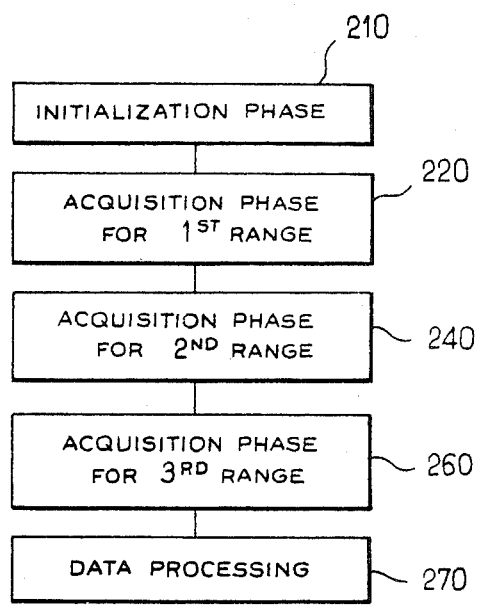
FIG_12

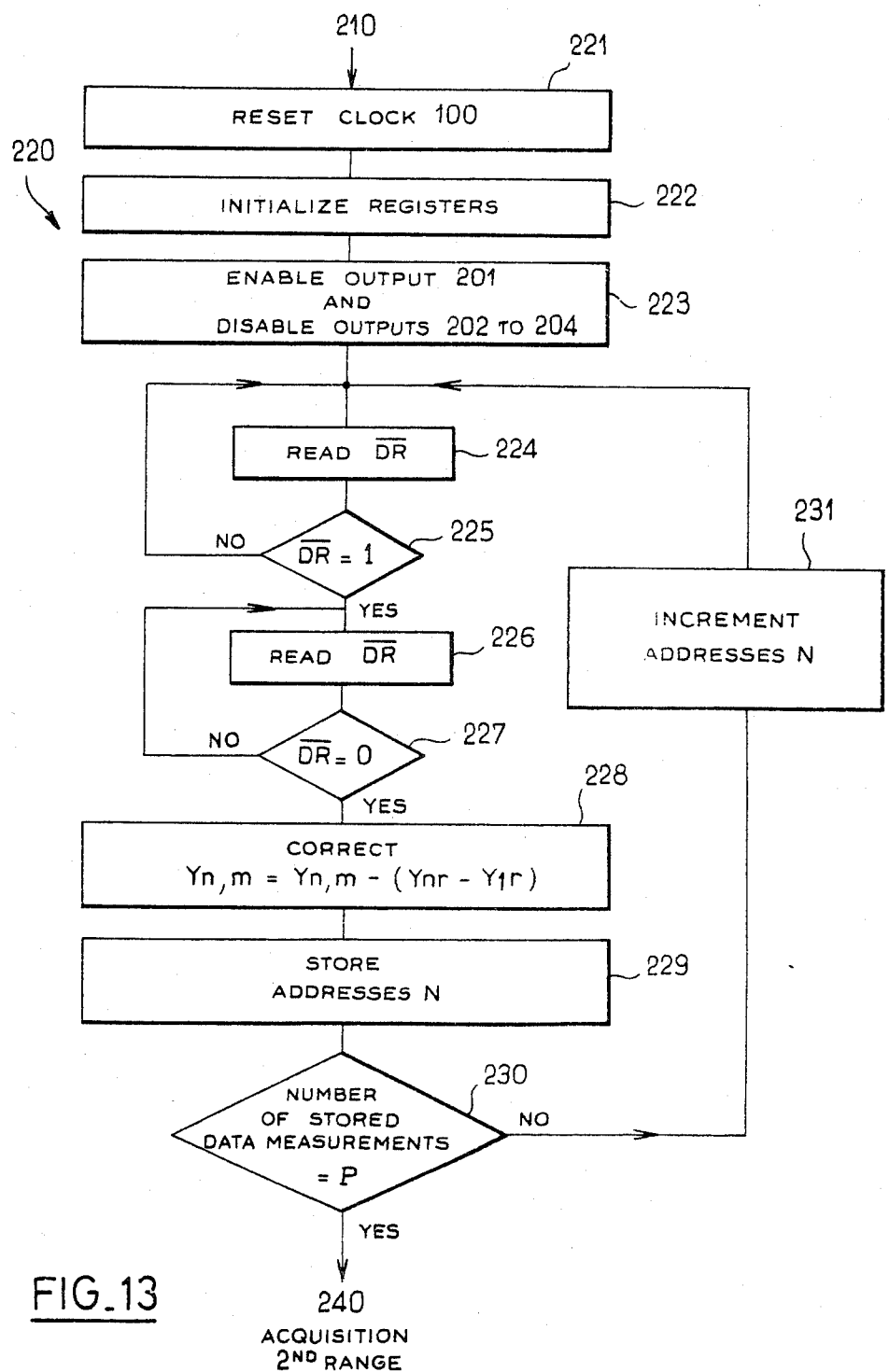
FIG_13

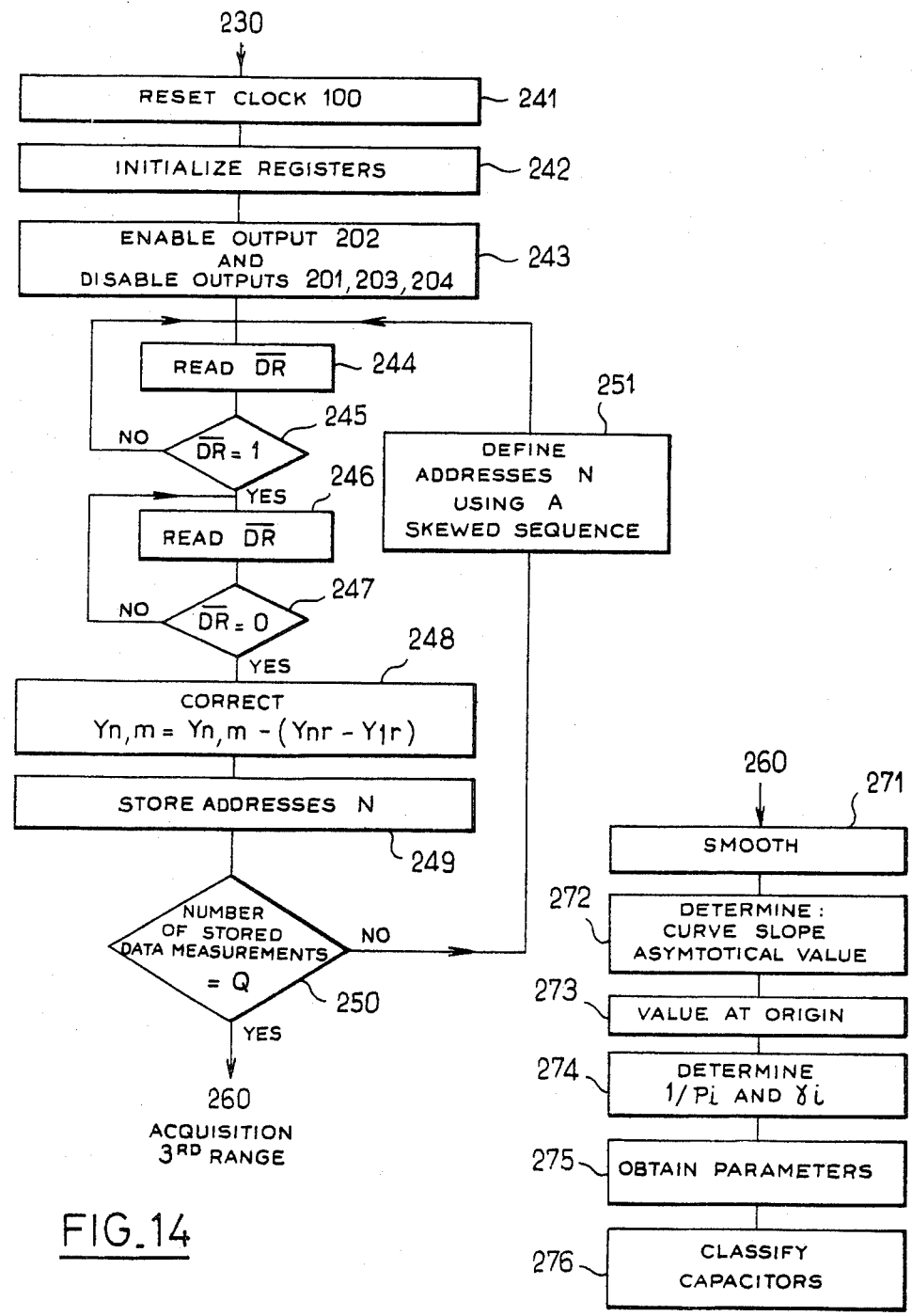

METHOD AND APPARATUS FOR RAPIDLY TESTING CAPACITORS AND DIELECTRIC MATERIALS

The present invention relates to a method and to apparatus for rapidly testing capacitors and dielectric materials.

BACKGROUND OF THE INVENTION

Apparatus available so far for testing dielectric materials or capacitors either operates at one frequency only, or else takes a particularly long time to perform the tests.

The present invention seeks to provide a novel method and apparatus for rapidly obtaining the frequency response of said dielectric materials or capacitors over a wide range of frequencies, for example from 10 Hz to 1 MHz.

The present invention thus enables a very much more thorough quality control to be performed.

More precisely, the present invention seeks to determine the parameters $R_i$ and $C_i$ of a capacitor or of a dielectric material as represented by the Foster model, as shown in the accompanying FIG. 1.

It is recalled that Foster's theorem shows that a non-ideal capacitor may be represented by an equivalent network made up of resistances and capacitances. As shown in the accompanying FIG. 1, this equivalent network comprises a plurality (n) of parallel-connected branches, each of which is constituted by a resistance $R_i$ and capacitance $C_i$ connected in series, together with two special branches which are likewise connected in parallel and which take limiting conditions into account. These special branches are respectively constituted by a pure capacitance $C_\infty$ and by a pure resistance $R_s$.

This leads to the capacitance of a capacitor being written in the form:

$$C(t) = C_\infty + \frac{t}{R_s} + \sum_i C_i(1 - e^{-t/\tau_i}) \quad (1)$$

where $\tau_i = R_i \cdot C_i$.

The aim of the present invention is consequently to determine the above-mentioned parameters $C_\infty$, $R_s$, $R_i$ and $C_i$.

SUMMARY OF THE INVENTION

The dielectric material test method, suitable in particular for testing capacitors, in accordance with the present invention comprises the following steps:

(i) inserting an item to be tested in series with a reference impedance in a measuring chain;

(ii) applying repetitive stimulating rectangular pulses to the measuring chain;

(iii) zeroing the voltage at the terminals of the reference impedance during each inactive half-cycle of the stimulating pulses;

(iv) sampling the response obtained at the terminals of the reference impedance for each stimulating pulse, at time instants which are progressively shifted relative to said stimulating pulses; and (v) analyzing the samples in order to deduce the parameters of the item under test in accordance with a Foster model.

More precisely, in accordance with the invention, the reference impedance is a capacitor which, preferably, has a capacitance which is about one thousand times greater than the capacitance of the item under test.

In accordance with an important feature of the invention the steps (ii) and (iv) of applying repetitive rectangular stimulating pulses and of sampling them are advantageously organized in a plurality of bursts of pulses with periods that increase from one burst to the next.

The above-mentioned steps (ii) and (iv) advantageously comprise, in succession:

applying a first series of stimulating pulses of constant period accompanied by a series of sampling pulses of constant period which period is slightly greater than the period of the stimulating pulses;

applying a second series of stimulating pulses of constant period which period is substantially greater than the period of the first series of stimulating pulses, accompanied by a second series of sampling pulses of constant period which period is slightly greater than a sub-multiple of the period of the stimulating pulses; and applying a single long-duration stimulating pulse together with sampling pulses at progressively increasing intervals.

Advantageously, the period of the first series of stimulating pulses is about 200 μs, the period of the second series of stimulating pulses is about 2 ms and the last stimulating pulse has a duration which is greater than 700 ms.

In accordance with another advantageous feature of the invention, analysis step (v) may comprise:

(va) determining the final slope of the response as being representative of the parameter $1/R_s$ of the Foster model; and (vb) determining the initial asymptotic value of the response as being representative of the parameter $C_s$ of the Foster model, where $C_s = C_\infty + \Sigma C_i$.

More precisely, and advantageously, in accordance with the invention step (va) may consist in comparing the slope of the response at different instants and in taking the slope as final when the value is considered as being identical over a plurality of instants, and step (vb) may consist in determining the initial asymptotic value by subtracting the product of the final slope and the X co-ordinate of the n-th sample from the value of the n-th sample.

According to another advantageous feature of the invention, step (v) may include:

(vc) determining the initial value of the response as being representative of the parameter $C_\infty$ of the Foster model.

More precisely, and advantageously, in accordance with the invention step (vc) consists in determining the initial value of the response by extrapolation from the second and third samples and considering the average time origin $t_0$ as being equal to:

$$t_0 = t_2 - (3\delta T/2) \quad (2)$$

where $t_2$ represents the instant at which the second sample is acquired and $\delta T$ represents the sampling interval.

In accordance with another advantageous feature of the invention, step (v) may include:

(vd) determining the amplitudes of steps in the curve of the slope of the response as being representative of the parameter $1/R_i$ of the Foster model; and (ve) determining the X co-ordinates of the maxima of the derivative of the slope of the response as being representative of the relaxation periods of the various R-C branches of the Foster model.

In accordance with another advantageous feature of the invention, analysis step (v) may include the step of converting the parameters y(t) determined on the basis of the samples so as to obtain the capacitance parameters in accordance with a linear conversion law: $C(t) = K[y(t)+a]$, where K and a are constants.

Preferably, and in accordance with the invention, the test method may includes a preliminary step consisting in:

disposing two reference capacitors Cr1 and Cr2 in series in the measuring chain;

detecting the response v'(t) to the application of single pulse stimulation of amplitude V to the measuring chain such that $$v' = (VG.Cr1/Cr2) - a' \qquad (3)$$

where G represents the gain of the system, and a' represents an additive constant due to zeroing the measuring chain; and the step (v) of the method should then include a further step consisting in correcting the measured values y(t) on the basis of the coefficients G and a to obtain the parameters of the capacitance C(t) according to the Foster model using the relationship:

$$C(t) = K(y(t)+a). \qquad (4)$$

Preferably, the test method further includes a subsequent step of classifying the tested items on the basis of the parameters as determined from the samples.

Advantageously, the test method further includes steps consisting in taking a reference sample $Y_{nr}$ for each pulse at a constant instant r in said pulses and in correcting each sample $Y_{nm}$ prior to analysis step (v) using the relationship:

$$Y_{nm} = Y_{nm} - (Y_{nr} - Y_{1r}) \qquad (5)$$

where: $Y_{nr}$ represents the reference sample taken during the n-th pulse; and $Y_{1r}$ represents the reference sample taken during the first pulse.

The test apparatus for testing dielectric materials, and in particular for testing capacitors, in accordance with the present invention comprises:

a measuring unit suitable for receiving the item to be tested in series with a reference impedance in a measuring chain;

a clock suitable for applying repetitive stimulating pulses to the measuring chain;

means suitable for zeroing the voltage at the terminals of the references impedance during each inactive half-cycle of the stimulating pulses;

a sampling unit sensitive to the response obtained at the terminals of the reference impedance during each stimulating pulse, and which samples said response at time instants which are progressively shifted relative to the stimulating pulses; and a processing unit which analyses the samples taken by the sampling unit and which deduces the parameters of the item under test according to a Foster model.

Preferably, the reference impedance is a reference capacitor whose capacitance is about one thousand times greater than the capacitance of the item under test.

In accordance with an advantageous feature of the invention, the measuring unit may include means suitable for modifying the reference impedance inserted in the measuring chain.

In accordance with another advantageous feature of the invention, the sampling unit may include an analog-to-digital converter.

Preferably, the processing unit controls the clock in such a manner that the clock generates a plurality of successive bursts of stimulating pulses with the pulse period increasing from one burst to the next.

More precisely, and preferably, the clock generates in succession:

a first series of stimulating pulses of constant period accompanied by a series of sampling pulses of constant period which period is slightly greater than the period of the stimulating pulses;

a second series of stimulating pulses of constant period which period is substantially greater than the period of the first series of stimulating pulses, accompanied by a second series of sampling pulses of constant period which period is slightly greater than a sub-multiple of the period of the stimulating pulses; and then a single long-duration stimulating pulse accompanied by sampling pulses at progressively greater intervals.

Yet more precisely, and advantageously, the period of the stimulating pulses in the first series should be about 200 µs, the period of the stimulating pulses of the second series should be about 2 ms, and the last stimulating pulse should last for more than 700 ms.

In accordance with an advantageous feature of the present invention, the clock may comprise:

a master oscillator;

a plurality of frequency dividers driven by the master oscillator for providing stimulating pulses at respective periods;

AND gates connected to the outputs from the dividers and selectively enabled by the processing unit; and an OR gate having inputs connected to respective outputs from the AND gates, and having an output at which the stimulating pulses are available.

In accordance with another advantageous feature of the invention, the clock may include:

a second series of frequency dividers driven by the master oscillator and determining sampling pulses of respective periods;

a second series of AND gates connected to respective outputs from the frequency dividers of the second series and which are selectively enabled by the processing unit synchronously with one of the associated AND gates of the first series; and a second OR gate whose inputs are connected to respective outputs of the second series of AND gates and whose output provides the sampling pulses.

In accordance with the invention, and preferably, the clock may also generate auxiliary sampling pulses at a constant instant in each stimulating pulse, in order to take reference samples.

In accordance with another preferred feature of the invention, the measuring unit may incluce, in succession between the measuring chain and the sampling unit, a decoupling stage having very high input impedance and at least one amplifier stage.

Preferably, the connection between the measuring stage and the decoupling stage is, in addition, screened.

In accordance with another feature of the invention, the means for zeroing the voltage at the terminals of the reference impedance have very high output impedance.

In accordance with an advantageous embodiment, the means for zeroing the voltage comprise a field effect transistor.

In accordance with another advantageous feature of the invention the sampling unit may comprise a blocking sampler, an amplifier stage, and an analog-to-digital converter connected in cascade.

BRIEF DESCRIPTION OF THE DRAWINGS

An implementation of the invention is described by way of example with reference to the accompanying drawings in which:

FIG. 2 is a diagram of a measuring chain used in the apparatus in accordance with the present invention;

FIG. 3 shows a response curve to one level of stimulation;

FIG. 4 shows the slope of the response curve;

FIG. 5 shows the derivative of the slope of the response curve;

FIG. 6a is a diagram of one test cycle including a plurality of bursts of stimulating pulses and of sampling pulses;

FIG. 6b is a waveform diagram relating to the first burst and shows the stimulating pulses, the response thereto, and the sampling pulses;

FIG. 6c is a waveform diagram relating to the second burst and shows the stimulating pulses, the response thereto, and the sampling pulses;

FIG. 11 is a circuit diagram of a sampling unit with integrated analog-to-digital conversion included in the test apparatus in accordance with the present invention;

FIG. 12 is a flowchart outlining the sample processing performed by apparatus in accordance with the invention;

FIG. 13 is a more detailed flowchart relative to the acquisition of the first set of samples;

FIG. 14 is a more detailed flowchart relative to the acquisition of the second set of samples; and FIG. 15 is a flowchart relative to sample processing after acquisition.

MORE DETAILED DESCRIPTION

Figure 1:
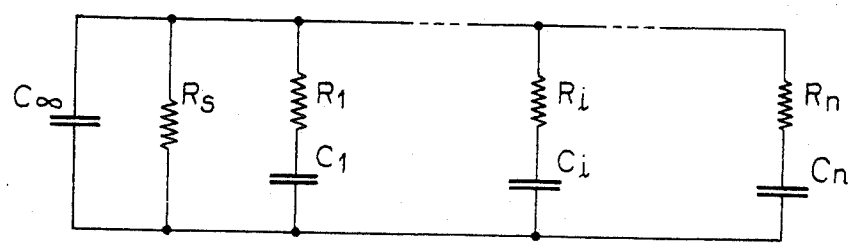
FIG. 1 shows the Foster model as described above.

The following detailed description concerns the testing of a capacitor. This description and the accompanying drawings should not be taken as limiting the application of the invention. The invention is applicable in a general manner to testing dielectric materials.

The following description is organized as follows:
1. measuring theory;
2. the general structure of the apparatus;
3. the structure of the clock;
4. the structure of the measuring unit;
5. the structure of the sampling and analog-to-digital conversion unit; and
6. the function and the structure of the processing unit.

MEASURING THEORY

As illustrated in FIG. 2, the basic principle of the invention consists in applying a voltage level V to a measuring chain comprising a capacitor to be tested connected in series with a reference capacitor. The capacitance of the capacitor to be tested is Cx and the capacitance of the reference capacitor is Cr, with Cr being selected such that $Cx << Cr$.

Then, using Laplace notation, it can be shown that:

$$v(p) = \frac{V}{p} \cdot \frac{Cx(p)}{Cr + Cx(p)} \approx \frac{V \cdot Cx(p)}{p \cdot Cr} \quad \text{whence} \tag{6}$$

$$v(p) = \frac{V}{Cr} \left[ \frac{C\infty}{p} + \frac{1}{Rsp^2} + \sum_{i=1}^{n} \frac{Ci}{(1 + RiCip)p} \right] \text{ and thus} \tag{7}$$

$$v(p) = \frac{V}{Cr} \left[ C\infty + \frac{t}{Rs} + \sum_{i=1}^{n} Ci(1 - e^{-t/RiCi}) \right] \tag{8}$$

In the case of a single dispersion domain, i.e. when $n=1$, the parameters of the equivalent circuit may be obtained very easily.

as can be seen in FIG. 3, the value $C\infty$ and Cs (where $$Cs = C\infty + \sum_{i=1}^{n} Ci$$

are easily accessible as the initial value and the asymptotic value of the curve $(Cr/V) v(t)$. The conductivity term $1/Rs$ is determined by analyzing the slope $\alpha$ of the asymptote where $\tan \alpha = 1/Rs$. The conductance $1/R1$ is determined by analyzing the slope $\gamma$ at the origin where $\tan \psi = 1/Rs + 1/R1$, and the relaxation time $\epsilon = R1.C1$ and is determined by the intersection between the initial slope and the asymptote to the curve.

When there is a plurality of domains $(n>1)$ the values $1/Ri$ may be obtained by analyzing the slope as shown in FIG. 4:

$$\lambda(t) = \frac{\partial}{\partial t}\left[ \frac{Cr \cdot v(t)}{V} - \frac{t}{Rs} \right] = \sum_{i=1}^{n} \frac{1}{Ri} e^{-t/\tau i} \tag{9}$$

These values $1/Ri$ are equal to the widths of the steps in the curve of the slope $\lambda(t)$, as shown in FIG. 4.

The $Ri.Ci = \tau i$ terms may also be obtained by analyzing this curve since these terms correspond for each step to the X co-ordinate of the point at which the curve passes through the value $0.37/Ri$.

Further, analysis of the second derivative $\lambda'(t)$ as shown in FIG. 5 gives the number of relaxation domains (corresponding to the number of maxima) and also the abovementioned values $\tau i$ (which correspond to the X co-ordinates of the said maxima).

In order to cover a test frequency range extending from 10 Hz to 1 MHz, and taking into account both Shannon's sampling theory and of the influence of frequencies greater than the arbitrary upper limit taken at $F_M = 10$ MHz, a sampling period is selected such that $T0 \approx \frac{1}{2}\pi F_M$, i.e. $T0 = 0.2$ μs.

However, conventional components for performing analog-to-digital conversion on 10 bits require a conversion period of about 25 μs and consequently they theoretically require a sampling period which is not less than 25 μs, i.e. which is completely incompatible with the above-specified sampling period of 0.2 μs.

In order to avoid this difficulty, and in accordance with an important feature of the present invention, the Applicant proposes replacing the stimulating single step by a periodic pulse waveform, with the initial conditions of the capacitor under test being zeroed prior to each rising edge in the pulse waveform so as to obtain periodic repetition of the initial response to the signal step.

More precisely, in accordance with the invention a periodic pulse waveform having a period T and a duty ratio of ½ is applied to the measuring chain and the response is sampled with a period $T+\delta T$, which is greater than the period of the exciting pulse train, with $\delta T=0.2$ μs. The capacitor under test is zeroed during the low level portions of the rectangular excitation signal having a duty ratio of ½.

The difference $\delta T$ between the sampling period and the stimulating period shifts the relative position of the sample $n+i$ taken during pulse $n+i$ relative to the period of the sample n in pulse n.

Thus, a time transposition is performed and a long period of time T is available for converting each sample of equivalent duration $\delta T=0.2$ μs, thus enabling the time T to be considerably greater than the minimum time of 25 μs required for analog-to-digital conversion.

The capacitor under test is reset to zero by short-circuiting the reference capacitor which is connected in series therewith such that both ends of the capacitor under test are connected to zero potential.

However, the Applicant has observed that the potential difference at the terminals of the capacitances Ci integrated in the series branches Ci-Ri of the Foster model cannot be cancelled during the low half cycle of the stimulating pulse waveform unless the time constant $\tau i = Ri.Ci$ is small relative to the period $\theta$ during which the capacitor is zeroed.

When this condition is not true, the resulting signal is distorted.

When the zeroing period $\theta$ is equal to half the sampling period T/2:

for $\tau i \approx T/2$, the response obtained corresponds to the response to a single step multiplied by a coefficient of $1/(1+e^{-T/2\tau})$; and when $\tau i$ is $>>T/2$, no component from the corresponding branch is included in the overall signal.

However, in practice, for technical reasons it is convenient to avoid simultaneously applying the stimulus and suddenly resetting to zero. In other words, the reset to zero period $\theta$ of the capacitor under test is, in practice, less than one-half of the period T/2 of the stimulating pulse waveform.

This also distorts the response obtained, and as a result, denoting the difference between the zeroing period $\theta$ and one-half of the stimulating period as $\Delta T$: $\theta = T/2 - \Delta T$:

when $\tau >> T/2$ the response given by the same pulse may be expressed by the relationship:

$$vn(t') = -\frac{VC}{Cr} \times \frac{\Delta T}{\tau} \left[ 1 - \sum_{h=0}^{2n} (-e^{-T/2\tau})^h \right] \quad (10)$$

where $h=2n-k$, and $k=2n$ for even values and $k=2n+1$ for odd values while $t'=T-nT$, the responses are consequently by constant steps; and for $\tau \approx T/2$, a steady state is attained in one or two periods and the response given by the n-th pulse may be expressed by the the relationship:

$$vn(t') = \frac{V}{Cr} C \left[ \frac{1}{1+e^{-T/2\tau}}(1 - e^{-t'/2\tau}) - \frac{e^{-T/2\tau}}{1+e^{-T/2\tau}} \frac{\Delta T}{\tau} \right] \quad (11)$$

By comparing the above relationships to the single-step response:

$$v(t') = \frac{V}{Cr} C(1 - e^{-t'/2\tau}) \quad (12)$$

it may be deduced that:

when the zeroing period $\theta$ is equal to one-half of the stimulating period, the repetitive response of each pulse is identical to the beginning of the response to a single step up to the end of each pulse to within a factor of $1/(1+e^{-T/2\tau i})$ which must be taken into account for determining Ci (which correction factor is equal to unity for periods $\tau i << T$); and with a zeroing period $\theta$ less than one-half of the stimulating period, the above conclusions remain true provided the step resulting from the existence of $\Delta T$, is cancelled or compensated for. This step is constant during a pulse and under transient conditions it varies from one pulse to the next. From relationship (11) it can be seen that this step is equal to:

$$\frac{VC}{Cr} \times \frac{e^{-T/2\tau}}{1+e^{-T/2\tau}} \times \frac{\Delta T}{\tau}$$

when $\tau \approx T/2$.

Furthermore, the Applicant has determined that the useful information in the signal has a logarithmic time function. This leads to taking a high density of samples for short periods of the time response (associated with the high frequencies of the harmonic response) and to taking samples at a lower density for medium periods, and lower still for long periods (associated with the low frequencies of the harmonic response) and thus to organizing the stimulation and the sampling in a plurality of ranges, e.g. three ranges, as shown diagrammatically in FIG. 6a.

The first range may be constituted, for example, by a burst of 500 stimulating pulses having a period of 200 μs and using response sampling signals having a period of 200.2 μs, thus constituting a time vernier relative to the stimulation. This range has a real duration of 100 ms, enabling sampling instants having a period of 0.2 μs to be sampled in the range 0.2 μs to 100 μs, thereby covering the equivalent of a 1 MHz frequency response.

A single sample is taken during each stimulation period as is shown in FIG. 6b and the 200 μs of said period is available for sampling and for conversion to digital form.

The second range may be constituted, for example, by 10 stimulating pulses having a period of 2 ms, in conjunction with sampling pulses having a period of 202 μs. This range has a real duration of 20 ms and serves to analyze sampling instants up to 1 ms at a sampling interval equivalent to 20 μs.

In this case, 10 samples are generated per stimulation period, but only five of them are useful in that they correspond to the high level half cycle of the stimulating pulse. Here again, the available conversion time is about 200 μs. This is illustrated in FIG. 6c.

Finally, the third range is constituted by a single pulse whose duration may be 800 ms, for example, and which is sampled in real time at short time intervals up to 32 ms, and then with wider time intervals for the remainder of the pulse.

Algorithms for determining the capacitor parameters $C\infty$, Rs, Ri and Ci are described below.

There now follows a description of the structure of the apparatus shown in FIGS. 7 to 15.

GENERAL STRUCTURE OF THE APPARATUS

Figure 7:
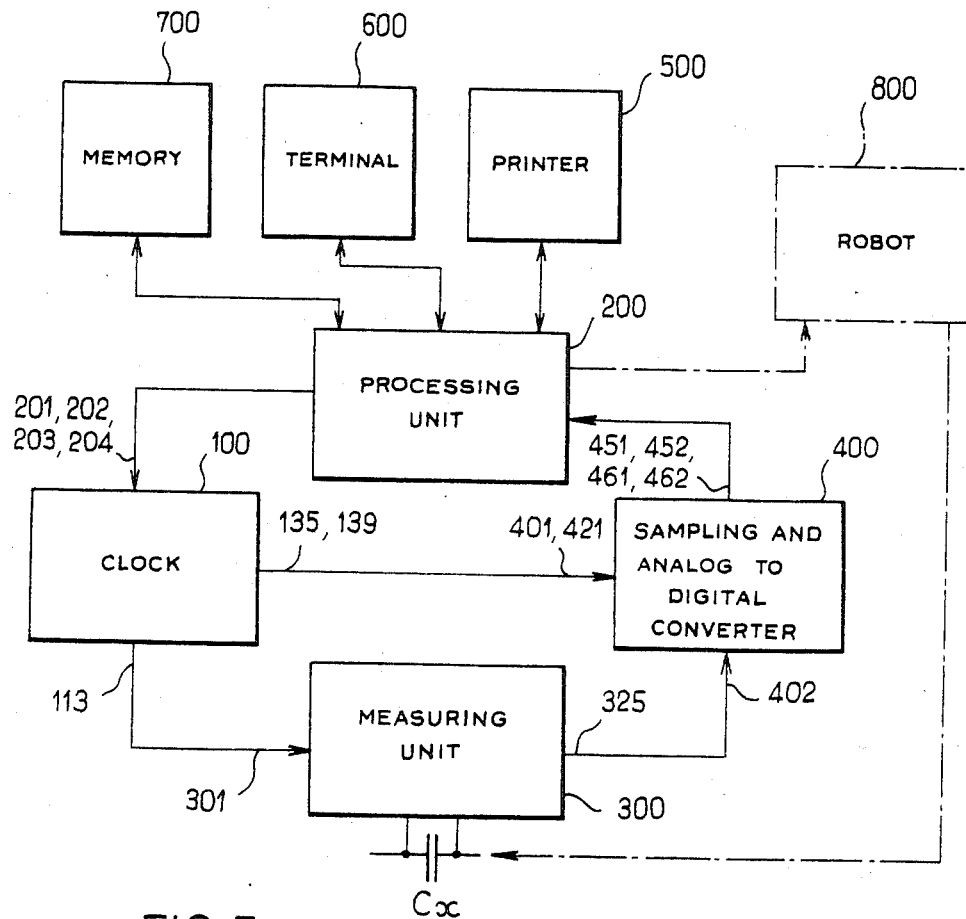
FIG. 7 is a block diagram showing the general structure of the test apparatus in accordance with the present invention.

As can be seen in FIG. 7, the apparatus in accordance with the present invention comprises a clock 100 controlled by a processing unit 200. The clock 100 supplies clock pulses both to a measuring unit 300 which receives the capacitor to be tested and to a unit 400 connected to the measuring unit 300 and which is sensitive to the response of the capacitor to a periodic pulse waveform and which samples said response and performs analog-to-digital conversion of the signal. The digital signal samples are then applied to the above-mentioned processing unit 200 which subsequently determines the said parameters $C\infty$, Rs, Ci, and Ri.

The function and the structure of each of the four main blocks 100, 200, 300 and 400, are described in greater detail below.

However, it may be observed that the processing unit 200, in addition to controlling the sequencing of the various bursts of pulses generated by the clock 100, and in addition to performing the processing operation per se, also supervises communications with conventional peripheral devices such as a printer 500, a terminal 600 including a screen and a keyboard, an auxiliary memory 700, and, where appropriate, a capacitor-manipulating robot 800.

The communications with the conventional peripheral units 500, 600 and 700 serve to output data and to receive operating instructions.

The robot 800 may be used to automatically insert the capacitors Cx into the measuring chain of the unit 300, to remove the capacitors therefrom, and to sort the removed capacitors as a function of the measured characteristics thereof.

CLOCK 100

The main function of the clock 100 is to generate the excitation pulses and the sampling pulses.

More precisely, the clock 100 serves to generate several ranges of excitation pulse periods accompanied with sampling pulses which are progressively shifted relative to the successive instants at which the stimulus is applied, together with the introduction of fixed delays in order to ensure proper observation of the beginning of the response. The sampling instants must also take account of the minimum time required to perform analog-to-digital conversion.

Figure 8:
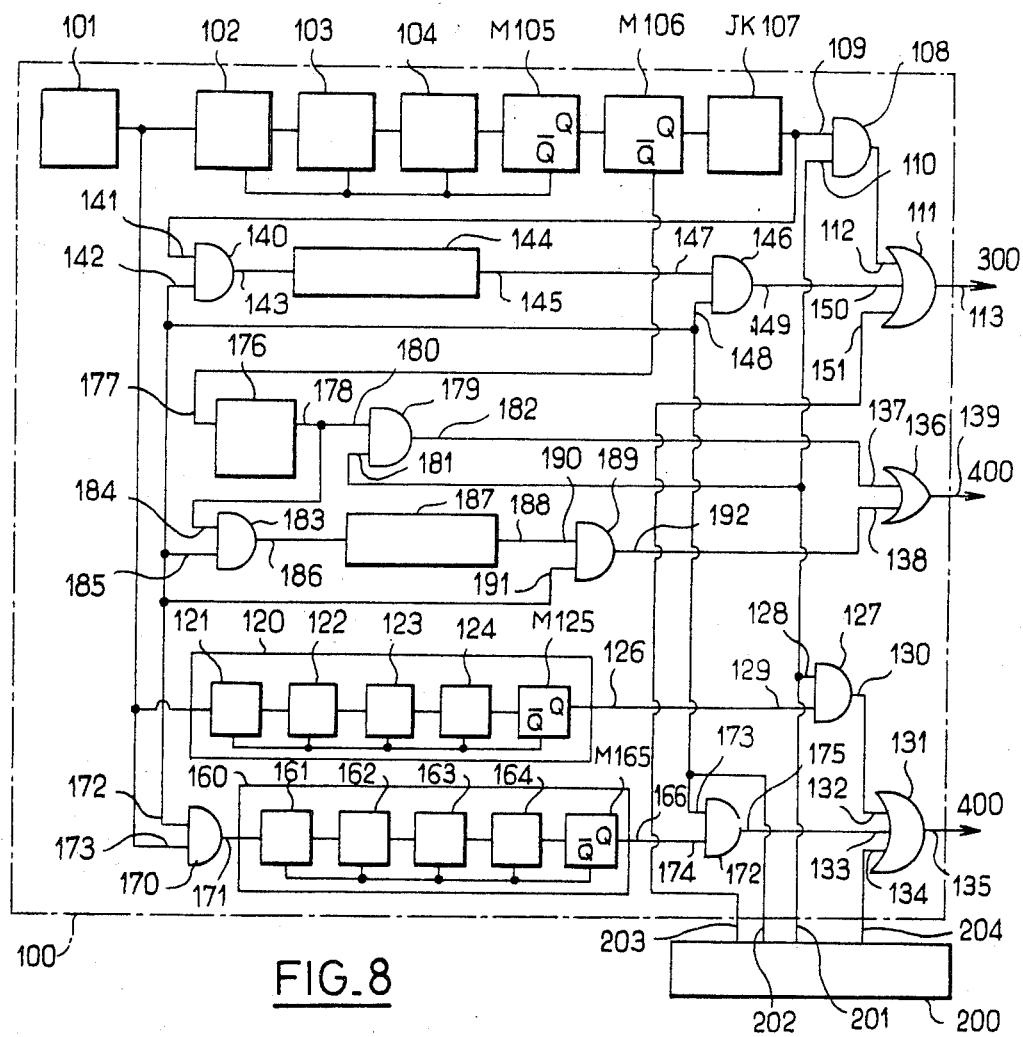
FIG. 8 is a circuit diagram of the clock circuit included in an apparatus in accordance with the invention.

As shown diagrammatically in FIG. 8, the processing unit applies sequencing signals to the clock 100. When turned on, and at the beginning of each measuring cycle, the processing unit 200 resets the apparatus overall to zero. In order to simplify the figures, the reset to zero inputs to the components of the clock 100 are not shown in FIG. 8.

Initially, the processing unit 200 generates an enable signal on an output 201 for enabling the first range of excitation pulses and sampling pulses. A first data series is acquired by sampling and converting the signals present at the output from the measuring unit 300. The processing unit 200 counts the number of data measurements acquired.

Once a predetermined number of data measurements has been acquired, the output 201 is no longer enabled and the processing unit delivers an enabling signal on an output 202 for enabling the second range of excitation pulses and sampling pulses. A second data series is thus acquired.

Here again, once a predetermined number of data measurements has been obtained during said second acquisition period, the output 202 is no longer enabled and the processing unit generates an 800 ms pulse on an output 203 together with a sampling signal at a period of 160 μs, for example.

The various periods of the excitation pulses and of the sampling pulses in the first and second bursts are determined by dividing the frequency of a master oscillator 101.

This oscillator may be constituted, for example, by a logic gate oscillator driven by a 5 MHz crystal.

The first burst of excitation pulses is obtained by dividing the oscillator frequency by 1000, thus giving pulses having a period of 200 μs, and the sampling pulses are obtained by dividing the oscillator frequency by 1001, thus giving pulses with a period of 200.2 μs.

As shown in FIG. 8, the frequency of the oscillator 101 is divided by 500 by means of three counters 102, 103, and 104 which are connected in cascade, and which respectively divide by 10, by 10, and by 5. The output from this cascade (i.e. the output from 104) is applied to a monostable M105 which has a $\overline{Q}$ output for controlling the counters 102, 103, and 104. More precisely, the monostable M105 enables counting by means of its $\overline{Q}$ output and in the absence of a reset to zero signal being applied to the counters 102, 103 and 104.

Figure 9:
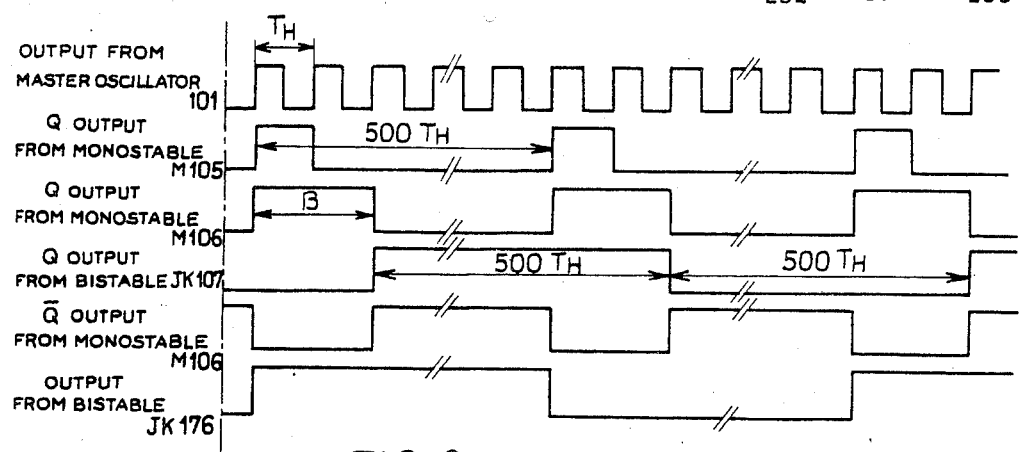
FIG. 9 is a waveform diagram showing signals at various points within the FIG. 8 clock.

The rising edge in the Q output from the monostable M105 controls a monostable M106 which has a pulse duration $\beta$, as shown by the second and third waveform lines in FIG. 9, in which the first line is a diagrammatic representation of the output signal from the oscillator 101.

The Q output from the monostable M106 is applied to a JK bistable JK107 which changes state on each falling edge in the signal on the Q output from the monostable M106, as shown in the fourth line of FIG. 9. The output from the bistable JK107 is applied to the first terminal 109 of an AND gate 108 having a second terminal 110 on which it receives the enabling signal for the first burst from the output 201 of the processing unit 200. The output from the AND gate 108 is connected to the first terminal 112 of an OR gate 111. It may be observed that the bistable JK107 divides the frequency of the output signal from the monostable 106 by two.

The output 115 from the OR gate 111 supplies excitation pulses and is connected to the measuring unit 300.

The delay $\beta$ provided by the monostable M106 relative to the time origin has the purpose of compensating for the delay due to the sample-and-hold circuit in the unit 400. This disposition is explained below.

However, in accordance with the invention, the said delay $\beta$ introduced by the monostable M106 is chosen to be greater than the minimum duration for a sampling pulse, such that a few zero value samples are taken during the low level of the stimulating waveform corresponding to the zeroing phase. This disposition makes it possible to clearly locate the first real sample in that it is the first non-zero sample.

As can be seen from the above description and from an examination of FIGS. 8 and 9, pulses are thus obtained at the output from the bistable JK107 (see FIG. 9 line 4) having a period of 200 μs and a duty ratio of ½. These pulses are delayed by a duration β relative to the time origin.

The signals present at the output from the bistable JK107 appear at the output 113 of the OR gate 111 when the AND gate 108 is enabled, i.e. when a high level signal is applied to the input 110 thereof by the output 201 from the processing unit.

As mentioned above, the sampling pulses are obtained by dividing the oscillator frequency by 1001 in order to obtain pulses having a period of 200.2 μs.

This division by 1001 is performed by the item referenced 120 in FIG. 8.

In practice this item 120 may be constituted by four counters 121, 122, 123 and 124, each of which is capable of counting from N to 9 where 0<N<9, and which are preset to a value of 8999. The counter chain 121-122-123-124 feeds a monostable M125 whose $\overline{Q}$ output enables counting in the absence of a reset to zero signal being applied to the said counters 121 to 124.

The $\overline{Q}$ output of the monostable M125 is enabled when the count reaches 10,000, thereby effectively dividing by 1001 by counting from 8999 to 10,000.

The Q output referenced 126 from the monostable 125 constitutes the output from the divider 120 and is connected to a first terminal 129 of an AND gate 127, which has a second terminal 128 connected to receive the first-burst-enabling signal from the output 201 of the processing unit 200.

The output 130 from the AND gate 127 is connected to the first terminal 132 of a three-input OR gate 131 having an output 135 which is connected to the sampling and analog-to-digital conversion unit 400.

As can be seen from the above description, pulses are obtained at the output 126 of the monostable 125 having a period of 200.2 μs and which therefore slip progressively relative to the stimulating pulses.

The signals present at the output 126 from the monostable 125 appear at the output 135 of the OR gate 131 whenever the AND gate 127 is enabled, i.e. whenever a high level signal is applied to the input 128 thereof by the output 201 from the processing unit.

The second burst of excitation pulses is obtained by dividing the excitation pulses of the first range by 10, thus giving rise to stimulating pulses having a period of 2 ms, while the sampling pulses for the second burst are obtained by dividing the oscillator frequency by 1010, thus giving rise to pulses having a period of 202 μs.

During the second burst, five useful samples are taken during each active period of the excitation pulse waveform, at a sampling interval which is equivalent to 20 μs.

As is shown in FIG. 8, the output from the bistable JK107 is connected to a first input 141 of a two input AND gate 140, whose other input 142 receives the enabling signal for the second burst (from the output 202 of the processing unit 200). The output 143 from the AND gate 140 is connected to the input of a divide-by-10 circuit 144 for dividing the frequency of the signal present on the output from the bistable JK107.

The output 145 from the divide-by-10 circuit 144 is connected to a first input 147 of a two input AND gate 146 whose other input 148 is connected to receive the enabling signal for the second burst (output 202 from the processing unit 200). The output 149 from the AND gate 146 is connected to the second input terminal 150 of the above-mentioned OR gate 111.

As can be seen from the above description and from FIG. 8, pulses are thus obtained at the output from the divide-by-10 circuit 144 having a period of 2 ms and a duty ratio of ½. These pulses are delayed by a duration β relative to the time origin. This delay is introduced by the monostable M106 which is inserted between the oscillator 101 and the divide-by-10 circuit 144.

The signals present at the output from the divide-by-10 circuit 144 reappear at the output 113 of the OR gate 111 whenever the AND gate 146 is enabled, i.e. whenever a high level signal is applied to the input 148 thereof by the output 202 from the processing unit 200.

As mentioned above, the sampling pulses accompanying said second burst are obtained by dividing the frequency of the oscillator 101 by 1010, in order to obtain pulses having a period of 202 μs.

This division by 1010 is performed by an item referenced 160 in FIG. 8.

In practice, the item 160 is constituted in a similar manner to the item 120, i.e. by four counters 161, 162, 163 and 164, each of which is capable of counting from N to 9 where 0<N<9. These counters are initially set to 8990. The counter chain 161-162-163-164 supplies pulses to a monostable M165 which controls the counting of said counters 161, 162, 163 and 164 by means of its $\overline{Q}$ output in the absence of a reset to zero signal being applied to said counters.

Further, the input to the first counter 161 of the item 160 is connected to the output 171 of a two-input AND gate 170. The inputs 172 and 173 of this AND gate 170 are connected respectively to the output from the oscillator 101 and to the output 202 from the processing unit 200 for enabling the second range.

The $\overline{Q}$ output from the monostable 165 is enabled whenever the count in the item 160 reaches a value of 10,000, thereby dividing by 1010 by counting from 8990 to 10,000.

The Q output, referenced 166 from the monostable M165, constitutes the output from the divider 160 and is connected to a first input 174 of a two-input AND gate 172 whose second input 173 receives the signals for enabling the second burst from the output 202 of the processing unit 200. The output 175 from the AND gate 172 is connected to the second terminal 133 of the above-mentioned three-input OR gate 1341, whose output 135 is connected to the sampling and analog-to-digital conversion unit 400.

As can be seen from the above description, pulses are obtained at the output 166 from the monostable 165 having a period of 202 microseconds, which is slightly greater than a sub-multiple of the period of the stimulating pulses and which therefore slip progressively relative thereto.

The signals present at the output 166 from the monostable M165 appear at the output 135 of the OR gate 131 whenever the AND gate 172 is enabled, i.e. whenever a high level signal is applied to the input 173 thereof by the output 202 from the processing unit 200.

As has already been mentioned, the third range comprises a single pulse whose duration in 800 ms, for example, together with real-time sampling at short intervals up t 32 ms and at wider intervals for the remainder of the time.

The stimulating single step of 800 ms duration is generated by the processing unit 200 on its output 203. This output is connected to the third input terminal 151 of the OR gate 111.

Further, the real-time sampling is directly controlled by the processing unit 200 via its output 204 which is connected to the third terminal 134 of the OR gate 131.

It is explained above that the successive responses to periodic stimulating pulses may be considered as being a superposition of the beginnings of the single step response and of steps whose value at the first pulse changes from one pulse to the next.

To escape from this distortion, the Applicant proposes correcting the value of the amplitude measured during the n-th pulse by means of the value of the amplitude measured at the equivalent time during the first pulse.

In other words, the Applicant proposes taking a reference sample of each stimulating pulse at a predetermined fixed instant thereof.

To do this, the signals present at the $\overline{Q}$ output from the monostable M106 are used. As shown in the fifth line of FIG. 9, the $\overline{Q}$ output from this monostable M106 has a rising edge which is synchronous with the original oscillator pulses. The $\overline{Q}$ output from the monostable M106 is connected to the input 177 of a JK bistable 176 which divides the frequency of the signals from the monostable M106 by 2. Consequently, the output from the JK bistable delivers a rectangular waveform of period 200 μs which is not delayed relative to the time origin.

These pulses applied to the sampling unit 400 are used to control auxiliary acquisition of reference pulses on each response to an individual pulse at a fixed instant in the period thereof. To do this, the output 178 of the JK bistable 176 is connected to a first input 180 of a two-input AND gate 179 whose second input 181 receives the enable signal for the first range from the output 201 of the processing unit 200. The output 182 from the AND gate 179 is connected to a first input 137 of a two-input OR gate 136 whose output 139 is connected to the sampling unit 400 so as to control acquisition of reference samples during the first range.

Naturally, it is necessay to proceed likewise for acquiring reference samples during the second range.

To do this, the frequency of the non-delayed pulses of the first range of the JK bistable 176 is divided by 10. More precisely, the output 178 from the JK bistable 176 is connected to a first input terminal 184 of a two-input AND gate 183. The second input terminal 185 of this AND gate 183 is connected to the output 202 of the processing unit 200 for enabling the second range.

The output 186 from the AND gate 183 is connected to the input of a divide-by-10 circuit 187 whose output 188 is connected to a first input terminal 190 of a two-input AND gate 189 whose second input 191 receives the enabling signal for the second rage from the output 202.

The output 192 from the two-input AND gate 189 is connected to the second input terminal 138 of the OR gate 136.

Consequently, when the output 202 is enabled by the processing unit 200, the divider 187 generates a rectangular output waveform having a period of 2 ms.

The signals present at the output from the JK bistable 176 appear at the output 139 of the OR gate 136 whenever the AND gate 179 is enabled, i.e. whenever a high level signal is applied to the input 181 thereof by the output 201 from the processing unit.

In contrast, a signal having a period of 2 ms is present at the output from the divider 187 whenever the AND gate 183 is enabled (whenever a high level signal is applied to the input 185 thereof from the output 202 of the processing unit and consequently when the AND gate 189 is enabled in parallel). The signal present at the output from the divider 187 appears at the output 139 of the OR gate 136.

In a particular embodiment described by way of non-limiting example, the counters 102, 103, 104, 121, 122, 123, 124, 161, 162, 163 and 164 are 74192 type circuits and the monostables M105, M106, M125 and M165 are 74122 type circuits, while the JK bistables JK107 and 176 are 7476 type circuits.

THE MEASURING UNIT 300

Figure 10:
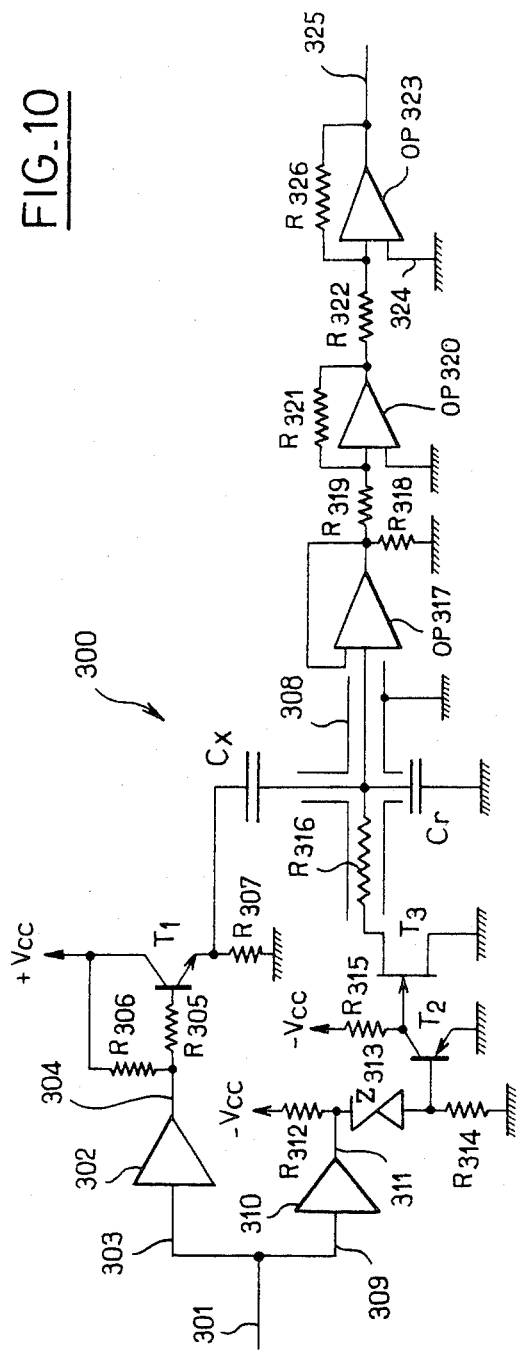
FIG. 10 is a circuit diagram of a measuring unit included in an apparatus in accordance with the present invention.

The measuring unit shown diagrammatically in FIG. 7 and in greater detail in FIG. 10 serves to shape the excitation pulses from the output 113 of the clock 100 with regard to their amplitude and rise time, to set their low level to a reference zero, to detect the response of the sample to the stimulus via the measuring chain constituted by the capacitive divider Cx and Cr, while isolating the output point from the measuring chain and transferring the response without distortion, and also while resetting the output point from the measuring chain to zero during the inactive periods of the stimulus.

The stimulating pulses are shaped by means of a shaping stage comprising an amplifier stage 302 and a transistor T1. More precisely, the output 113 from the clock 100 connected to the input 301 of the measuring unit 300 which is itself connected to the input 303 of the above-mentioned amplifier 302.

The output 304 from the amplifier is connected via a resistance 305 to the base of the transistor T1 which is an NPN type transistor connected in a common connector configuration.

As can be seen in FIG. 10, the collector of the transistor T1 is connected to a positive supply terminal +Vcc. The collector of the transistor T1 is also connected to the output 304 of the amplifier 302 via a bias resistance R306.

The emitter of the transistor T1 is connected to circuit ground via an emitter resistor R307.

The emitter of the transistor T1 is also connected to a first terminal of the capacitor Cx under test. The second terminal of this capacitor is connected to a first terminal of a reference capacitor Cr included in the measuring chain and whose second terminal is connected to circuit ground.

As a result, the measuring chain is supplied with stimulating pulses from the emitter of the transmitter T1.

As mentioned above, the reference capacitor Cr is chosen to have a capacitance which is about one thousand times the nominal capacitance of the capacitor under test Cx. In order to meet this condition under a range of circumstances, the measuring unit 300 advantageously includes means for switching between different reference capacitor Cr. These means are not shown in FIG. 19 in order to simplify the drawing.

The output from the measuring chain is taken from the common point between the capacitor under test Cx and the reference capacitor Cr. The voltage level at the output from this cell is low (about 15 mV). The measuring chain is therefore screened as represented at 308 in FIG. 10 in order to avoid superimposing noise on the useful signal.

There follows a description of the apparatus for enabling the output point of the measuring chain to be reset to zero during the inactive periods of the stimulating pulses.

This apparatus operates in parallel on the reference capacitor Cr. Naturally, this apparatus should distort the pure capacitance behavior of the reference capacitor as little as possible. Nonetheless, the Applicant has demonstrated that over the entire useful frequency range, the resetting to zero apparatus may be considered throughout the active phase of the process, i.e. when the stimulating pulse is at a high level, as having an equivalent circuit which associates a constant capacitance in parallel wih a constant resistance.

The said capacitance which is of the order of a few pF is added to the capacitance of the reference capacitor Cr and is easily taken account of. The parasitic resistance due to the resetting to zero apparatus is very high and does not, in practice, distort the capacitive behavior of the reference capacitor.

The input 301 of the measuring unit 300 is connected to the inoput 309 of an amplifier stage 310. The output 311 therefrom is connected via a resistance R312 to a negative supply terminal Vcc. Further, the output 311 from the amplifier stage 310 is connected to the cathode of a Zener diode Z313. The anode of the Zener diode Z313 is connected via a resistance R314 to circuit ground. Also, the anode of the Zener diode Z313 is connected to the base of a bipolar PNP transistor T2 connected in a common emitter configuration.

The emitter of this transistor T2 is connected to circuit ground while its collector is connected to a negative supply terminal $-V_{cc}$ via a load resistor R315.

Further, the collector of the transistor T2 is connected to the gate of a field effect transistor T3 whose source-drain channel is inserted via a resistance R316 between circuit ground and the common point between the capacitor to be tested Cx and the reference capacitor Cr.

During the low-level half-cycle of the excitation pulses, the transistor T2 is conductive and the field effect transistor T3 has its gate taken to zero potential and is therefore conductive. In contrast, during the high-level half-cycle of the excitation pulses the transistor T2 is off and lowers the gate of the field effect transistor T3 to a highly negative potential, thereby turning off the field effect transistor.

The output from the measuring chain Cx—Cr is connected to a decoupling stage whose purpose is to transmit the response while modifying the admittance of the reference capacitance Cr as little as possible.

The decoupling stage comprises an operational amplifier OP317 with internal frequency correction. This operational amplifier OP317 is directly connected via one of its inputs to the common point between the capacitor under test Cx and the reference capacitor Cr, while its output is directly connected to its second input in order to form a negative feedback loop.

The amplifier OP317 is thus connected as a voltage follower. By way of non-limiting example, this operational amplifier OP317 may be constituted by a LH 0052 type device. The Applicant has observed that such a device gives full satisfaction. The above-described circuit has an input resistance which is greater than $10^{10}$ ohms. Further, even under critical conditions in which the reference capacitor has a low value of about $10^{-8}$F, the input impedance due to the operational amplifier OP317 introduces an error in the tangent of the dielectric loss angle which is only about $10^{-4}$ at 10 Hz. Further, this error falls off very fast as frequency increases.

The above decoupling stage is followed by at least one amplifier stage.

More precisely, in the embodiment shown in FIG. 10, the decoupling stage OP317 is followed by two inverting amplifiers connected in series.

Still more precisely, the output from the operational amplifier OP317 is connected to circuit ground via a resistor R318. The output is also connected via a resistor R319 to a first input terminal of an operational amplifier OP320 whose second input is connected to ground. The output from the operational amplifier OP320 is fed back to said first input via a resistor R321. The output from the operational amplifier OP320 is connected via a resistor R322 to a first input of a second operational amplifier OP323 which is connected as an inverter. To do this the second input 324 of the operational amplifier OP323 is connected to ground and the output 325 of said amplifier is fed back to the first input via a resistor R326.

The output 325 from the operational amplifier OP323 is connected to the sampling unit 400.

In an advantageous implementation given by way of non-limiting example, the operational amplifiers OP320 and OP323 are AD507 and AD509 types, whereas the amplifier stages 302 and 310 are 7416 types.

In practice various distortions are applied to the signal. However, the Applicant has shown that:

(1) although the rise time of the stimulating pulses generated by the transistor T1 is not zero, but is about 50 ns, the effect of this distortion is negligible in the time domain for periods greater than or equal to 1 $\mu$s. In the domain of periods less than 1 $\mu$s, time measurements are offset by about 25 ns;

(2) the influence of the resistance connected in parallel with the reference capacitor Cr by the input impedance of the decoupling amplifier OP317 and the output impedance of the reset to zero circuit (the field effect transistor T3) is greater than $10^{10}$ ohms, and is negligible; and (3) the gain of the follower stages is constant over the entire useful frequency range.

Test apparatus in accordance with the present invention should be capable of monitoring capacitors having the usual values, i.e. it should at very least cover a range running from 1 pF to 1 $\mu$F. Such a wide range cannot be covered using a single reference capacitor. In order to cover this range, the Applicant proposes dividing the measurement process into two main ranges.

The first main range concerns testing capacitors whose capacitance lies between 0.3 pF and 30,000 pF.

The second main range concerns testing capacitors whose capacitance is greater than 30,000 pF.

The first main range is itself divided into five auxiliary sub-ranges.

The first auxiliary sub-range concerns capacitors to be tested having a capacitance in the range 0.3 to 3 pF. This first auxiliary sub-range uses a reference capacitance of 1000 pF.

The second auxiliary sub-range concerns capacitors to be tested having a capacitance in the range 3 to 30 pF. This second auxiliary sub-range uses a reference capacitance of 10,000 pF.

The third auxiliary sub-range concerns capacitors to be tested having a capacitance in the range 30 to 300 pF. This third auxiliary range uses a reference capacitance of 100,000 pF.

The fourth auxiliary sub-range concerns capacitors to be tested having a capacitance in the range 300 to 3,000 pF. This fourth auxiliary sub-range uses a reference capacitance of 1 $\mu$F.

The fifth auxiliary sub-range concerns capacitors to be tested having a capacitance in the range 3000 pF to 30,000 pF. This fifth auxiliary sub-range uses a reference capacitance of 10 $\mu$F.

For the second main measuring range which concerns capacitors having a capacitance greater than 30,000 pF, the Applicant proposes, in order to avoid loss of definition, to invert the reference capacitor Cr and the capacitor to be tested Cx relative to the implementation shown in FIG. 10. Naturally, in such a case the reference capacitor Cr to which the stimulating pulses are applied must satisfy the relationship $Cr \approx Cx/1000$. The response detected by the decoupling stage (the amplifier OP317) is then taken from the terminals of the capacitor to be tested Cx. The Applicant has shown that the response taken in this way corespond to the relationship:

$$v(t) = V \frac{Cr}{C_\infty^2} \left[ 2C_\infty - \left( C_\infty + \frac{1}{Rs} t + \Sigma\, Ci(1 - e^{-t/RiCi}) \right) \right] \quad (13)$$

It may be observed that this equation (13) which is applicable for the second main measuring range is very close to the equations described above. Thus, the processing unit can use the same type of processing and the same algorithms in both cases, and the description below relates only to the case where the reference capacitance is 1000 times greater than the capacitance to be tested.

THE SAMPLED AND ANALOG-TO-DIGITAL CONVERSION UNIT 400

The sampling and conversion unit 400 which is shown diagrammatically in FIG. 7 and in greater detail in FIG. 11 serves to sample the data and to act as a transfer interface between the measuring unit 300 and the processing unit 200.

More precisely, the sampling and conversion unit 400 serves to transform the sampled values of the analog response from the measuring unit 300 into a 10 bit binary code.

As shown in FIGS. 7 and 11, the sampling and conversion unit 400 is connected to the measuring unit 300 via an input 402, to the clock 100 via inputs 401 and 421, and has outputs 451, 452, 461 and 462 connected to the processing unit 200.

The function of each of these inputs and outputs is explained below.

Generally speaking, as can be seen in FIG. 11, the sampling unit 400 comprises in cascade a sample-and-hold circuit 405, an amplifier of adjustable gain 415, and an analog-to-digital converter 450.

However, as mentioned above, the sampler is capable of taking reference samples at a fixed instant in each stimulating pulse in addition to taking the measuring samples which pass through the chain constituted by the sampler hold circuit 405, the amplifier 415 and the converter 450. For this reason, the sampling and conversion unit includes a second chain for the reference data disposed in parallel with the above-mentioned chain. The second chain comprises a similar cascade of a sample-and-hold circuit 425 followed by an adjustable gain amplifier 435 and by an analog-to-digital converter 460.

The sample-and-hold circuit 405 serves to acquire and then temporarily store analog samples under the control of the clock 100.

The sample-and-hold circuit 405 is shown diagrammatically in FIG. 11 and comprises essentially an operational amplifier 406, a controllable switch 409, and an amplifier stage 411.

A first input 407 of the operational amplifier 406 is connected to the input 402 of the sampler unit 400 in order to receive analog signals from the measuring unit 300. The output 408 from the operational amplifier 406 is suitable for being connected via the controllable switch 409 to the input 412 of the amplifier stage 411.

The output from the amplifier stage 411 is connected to the second input 414 of the operational amplifier 406. The controllable switch 409 is controlled by the state of a signal applied to the input 410 of the sample-and-hold circuit 405.

This input 410 is connected to the $\overline{Q}$ output of a monostable 420 whose input is connected to the input 401 of the unit 400. This input 401 is connected to the output 135 of the clock 100 to receive the sampling pulses generated thereby.

Similarly, the second sample and hold circuit 405 comprises an operational amplifier 426 having a first input 427 connected to the input 402 of the sampling unit to receive analog signals from the measuring unit 300. The output 428 of the operational amplifier 426 is capable of being connected via a controllable switch 429 to the input 432 of an amplifier stage 431 whose output is fed back to the second input 434 of the amplifier 426. The controlable switch 429 is controlled by the state of the inpu 430 to the circuit 425. This input 430 is connected to the $\overline{Q}$ output from the monostable 440 whose input is connected to the input 421 of the unit 400. This input 421 is connected to the output 439 of the clock in order to receive reference sampling pulses.

In practice, the sample-and-hold circuits 405 and 425 may be constituted by AD582 type circuits sold by the Analog Devices Company. Such a circuit is capable of sampling analog signals with a peak-to-peak range of 10 volts and in a time of 6 $\mu$s. In addition, the sample and hold circuits 405 and 425 have a hold period for retaining data at their respective outputs 413 and 433 of about 25 $\mu$s, which is entirely compatible with the conversion time of 25 $\mu$s required by the converters 450 and 460 connected downstream therefrom.

The person skilled in the art will readily understand that the measurement data is sampled by closing and opening the controllable switch 409 in the sample and hold circuit 405. This closing and opening process is controlled by the sampling pulses from the output 135 of the clock 100.

Similarly, the reference samples are taken by closing and opening the controllable switch 429 in the sample and hold circuit 425, with the closing and opening process being controlled by sampling pulses from the output 139 from the clock 100.

Naturally, each of the sample and hold circuits 405 and 425 has a non-zero closure time for the sampling gate and a non-zero time for the output voltage to follow the input voltage.

These times could, in theory, distort the measurements.

However, it is recalled that in accordance with the invention the stimulating pulses present at the output 113 of the clock 100 are delayed relative to the sampling pulses. As a result the earliest samples likely to be taken are taken during the low level of the stimulating pulses and are thus of zero value. Therefore, by taking the first non-zero sample as the first valid sample the delays due to the sample-and-hold process do not distort the measurements.

Further as is explained in detail below, the value at the origin of the response curve is not determined on the basis of the first acquired data measurement, but by extrapolation from the second and third data measurements.

The outputs 413 and 433 of the sample-and-hold circuits 405 and 425 are respectively connected to the inputs of the adjustable-gain amplifiers 415 and 435. These amplifiers serve to match the dynamic range and output from the sample-and-hold circuits 405 and 425 to the respective input dynamic ranges of the analog-to-digital converters 450 and 460.

Finally, the outputs 416 and 436 from the amplifiers 415 and 435 respectively are connected to the inputs of the converters 450 and 460. The converters may be constituted by AD571 type circuits. These circuits convert a sampled input analog signal into a 10 bit word.

The digital signals generated by the converters 450 and 460 are made available on respective data buses 452 and 462 corresponding thereto, and these buses are connected to the processing unit 200.

Further, when digital data is available on either of the buses 452 and 462, the converters 450 and 460 generate low level data ready signals $\overline{DR}$ at the respective outputs 451 and 461. The digital data remains present on the buses 452 and 462 to be used by the processing unit 200 until the end of a control pulse applied to the converters 450 and 460 by the Q output of the monostables 420 and 440 respectively, as shown in FIG. 11.

As a result, when one of the monostables 420 or 440 puts a high level signal on its $\overline{Q}$ output, the associated sample-and-hold circuit proceeds to take a sample of the analog signal, and since the Q output from said monostable is at a low level, the associated converter clears its output.

Conversely, when the $\overline{Q}$ signal from one of the monostables goes low, the sample-and-hold circuit holds the sample it has acquired and the Q signal goes high, thereby enabling the associated analog-to-digital converter to begin conversion.

THE PROCESSING UNIT 200

This unit serves to control the clock 100 by means of sequencing signals to generate the various bursts of excitation pulses and sampling pulses and to control communications with the conventional peripheral devices 500, 600 and 700 and also with the robot 800 if one is present. The other important function of the processing unit is to process the signals from the sampling and analog-to-digital conversion unit 400.

Since the functions of controlling the clock and communicating with the conventional peripherals have already been described, the following detailed description relates only to processing the data from the unit 400.

As shown diagrammatically in FIG. 12, data processing comprises five main phases in succession: first there is an initialization phase 210, then an acquisition phase 220 for the first range of data, then an acquisition phase 240 for the second range of data, then an acquisition phase 260 for the third range of data, and finally there is a phase 270 in which the acquired data is actually processed.

The initialization phase 210 serves to introduce the coefficients required for performing the processing phase 270, i.e. the coefficients which are necessary for determining the parameters in steps 272, 273, 274 and 275 described below and the tolerance ranges enabling the tested capacitors to be sorted (step 276).

As mentioned above, data acquisition serves to store the data prior to processing it, and is divided into three phases 220, 240 and 260 which respectively correspond to the three ranges of excitation and sampling pulses defined by the clock 100.

The sub-programs in the first and second acquisition phases 220 and 240 take into account both the measuring samples due to the sampling pulses generated at the output 135 of the clock 100, and the reference samples due to the sampling pulses generated by the output 139 from the clock 100, in order to compensate for the step effects induced by resetting to zero and which effects change from one pulse to the next.

The corrections are performed prior to storing the data.

The acquisition phase 220 for the first range of data is now described with reference to FIG. 13.

As shown in FIG. 13, the phase 220 begins with a step 221 for resetting the clock 100 to zero. The step 221 is followed by a step 222 in which registers are initialized to determine firstly the number of data records which have been stored previously and secondly the address of the first data record.

Step 222 is followed by step 223 during which the processing unit enables its output 201 by applying a high level signal thereto, and disables its outputs 202, 203 and 204 by applying a low level signals thereto.

The system is then ready to acquire data. However, acquisition is also dependent on testing the line $\overline{DR}$ of the analog-to-digital converter 450. A high level signal on the line $\overline{DR}$ indicates that data is being converted and that transfer may not take place until the line $\overline{DR}$ goes low.

The waiting process is determined by steps 224 to 227.

In step 224, which follows step 223, the processing unit reads the state of the line $\overline{DR}$ and this state is tested at step 225.

If the line $\overline{DR}$ is high, i.e. data is being converted, step 225 is followed by step 226 which constitutes a delay loop.

However, if the line $\overline{DR}$ is not high, step 224 is repeated after step 225.

During step 226, the processing unit 200 reads the state of line $\overline{DR}$ again and this state is tested at the following step 227.

If the line $\overline{DR}$ is still high, i.e. if data is being converted, the step 226 for reading the state of the line $\overline{DR}$ is repeated.

However, when the line $\overline{DR}$ goes low a second time, i.e. analog-to-digital conversion is completed, step 227 is followed by a correction step 228.

The purpose of the correction step is to cancel the step effect due to the signal being reset to zero during the low level half cycles of the excitation pulses.

The correction on measurement signal $Y_{nm}$ taken at instant m in the n-th excitation pulse is performed using the reference signals (due to the reference sampling signals generated on output 139 of the clock 100).

More precisely, the correction makes use firstly of the reference sample $Y_{1r}$ taken during the first excitation pulse at instant r and the reference sample $Y_{nr}$ taken during the n-th pulse at the equivalent instant r.

The correction is performed on the basis of the relationship:

$$Y'_{nm} = Y_{nm} - (Y_{nr} - Y_{1r}) \quad (5)$$

Correction step 228 is followed by storage step 229.

Storage step 229 is followed by a test step 230 during which the processing unit 200 checks whether the number of stored data measurements is equal to a predetermined number P.

In particular, in the above-described example, P=500 since 500 data samples of 0.2 μs duration are to be taken.

If the test at step 230 is negative, step 224 is repeated after incrementing the data storage address during an intermediate step 231.

If the test of step 230 is positive, the acquisition phase for the first range of data is over and step 230 is followed by phase 240 for acquiring the second range of data.

The phase 240 for acquiring the second range of data is now described with reference to FIG. 14.

As shown in FIG. 14, phase 240 begins with a step 241 for resetting the clock 100.

Step 241 is followed by an initializing step 242 for initializing registers which determine the number of data measurements to be stored during the second acquisition phase and the number of storage addresses for the first data measurement in the second acquisition phase.

Step 242 is followed by step 243 during which the processing unit 200 enables its output 202 by applying a high level signal thereto and disables its outputs 201, 203 and 204 by applying low level signals thereto.

The system is then ready for the second data acquisition phase.

At step 244 following step 243, the processing unit 200 reads the state of line $\overline{DR}$ and tests this state at step 245.

If the line $\overline{DR}$ is high, a measurement is being converted and step 245 is followed by step 246 which is part of a delay loop.

However, if the line $\overline{DR}$ is not high, step 244 is repeated after step 245.

During step 246, the processing unit 200 reads the state of the line $\overline{DR}$ again and this state is tested at the following step 247.

If the line $\overline{DR}$ is still high, data is still being converted and step 246 for reading the state of line $\overline{DR}$ is repeated.

However, if line $\overline{DR}$ has gone low, analog-to-digital conversion has been completed and step 247 is followed by correction step 248.

The correction process is similar to that described in step 228 for the first data acquisition phase, and is performed on measurement signal $Y_{nm}$ taken at instant m of the n-th excitation pulse, and uses reference sample $Y_{1r}$ taken during the first excitation pulse at instant r and reference sample $Y_{nr}$ taken during the n-th excitation pulse at the equivalent instant r using the equation:

$$Y'_{nm} = Y_{nm} - (Y_{nr} - Y_{1r}). \quad (5)$$

Correction step 248 is followed by storage step 249.

Storage step 249 is followed by a test step 250 during which the processing unit 200 checks whether the predetermined number Q of second range data measurements has been stored.

In the present case Q=50 (5 useful data measurements taken during each of 10 excitation pulses) with 50 data measurements being taken at 20 μs intervals.

If the test at step 250 is negative, step 244 is repeated after defining a new storage address at intermediate step 251. This is explained below.

However, if the test at step 250 is positive, the second data acquisition phase 240 is completed and step 250 is followed by the acquisition phase 260 for the third data range.

During the second acquisition phase, the data measurements are not acquired in their natural order: i.e. 1st, 2nd, .... Rather, the data measurements are acquired in a skewed sequence: 1st, 6th, 11th, ... 2nd, 7th, 12th ... due to the fact that 5 samples are taken from each simulating pulse.

For this reason, the processing unit during step 251 has to define storage addresses for the data measurements using a skewed sequence which follows the real order in which data measurements are acquired.

The FIG. 14 flowchart is therefore simplified in this respect.

Missing from the flowchart are steps to ensure that zero value measurements obtained during the low level of cycles of the excitation pulses are ignored.

Further, in order to avoid storing redundant data, data measurements cooresponding to instants for which data measurements have already been stored during the first acquisition phase 220 may also be ignored.

Also, in order to perform correction steps 220 and 248, the processing unit 200 needs to take the reference samples into account while they are being generated.

The third acquisition phase 260 serves to investigate the performance of a capacitor at low frequency.

During this third phase, the processing unit 200 directly generates a single step for stimulating the capacitor, together with sampling pulses in real time.

The third acquisition phase 260 may be operated on the basis of the following three sub-steps.

Initially, 200 data measurements are acquired at a regular sampling interval of 160 μs up to time 32 ms.

Secondly, 9 data measurements are performed at 8 ms intervals up to time 96 ms.

Finally, 14 data measurements are acquired at intervals of 48 ms up to time 720 ms.

The third data acquisition phase thus acquires 223 data measurements.

Phase 270 for data processing per se is now described with reference to FIG. 15.

Processing phase 270 begins with a smoothing step 271 in which the stored raw data is smoothed in the natural order of samples as opposed to the order in which the measurements were actually made.

The purpose of the smoothing step is to reduce random distortions due, in the main, to quantification errors and to acquisition time errors.

To do this, smoothing is performed by the moving mean method.

More precisely, the mean value $y_m$ of the sample taken at time $t_{k+n/2}$ in a time interval $t_k - t_{k+n+1}$ (where k and n are integers) is defined using the relationship:

$$y_m = \frac{1}{n}\left[\frac{y_k + y_{k+n+1}}{2} + \sum_{i=k+1}^{n} y_i\right] \quad (14)$$

However, the number of points taken for establishing the moving mean increases from a low value at the beginning of each range to a higher value at the end thereof, in order to take account of the fact that the variation expected in the signal is greater at the beginning of a range than at the end of a range.

By way of example, in the first range, the first 10 points are not smoothed, the following points are smoothed over three points and the points at the end of the range are smoothed over eight points.

The processing unit then proceeds to determine various parameters during steps 272, 273 and 274 which are explained below.

However, the data analyzed during these steps 272, 273 and 274 are digitized voltage samples y(ti) and not capacitance samples C(t). The relationship between these two magnitudes is given by the following equation:

$$C(t) = K[y(t) + a] \quad (15)$$

Since this relationship is linear, the Applicant has determined that the characteristic parameters may be directly acquired from the function y(t) during steps 272, 273 and 274 in the form of intermediate parameters, which parameters are subsequently transformed into the real parameters $C\infty$, $1/Rs$, $Ci$, $Ri$ and $Cs$ at the following step 275.

The following relationship is true of the real parameters:

$$C(t) = C\infty + \frac{t}{Rs} + \sum_i Ci(1 - e^{-t/\tau i}) \quad (1)$$

and in terms of intermediate parameters it may be written as follows:

$$y(t) = \gamma\infty + \frac{t}{ps} + \sum_i \gamma i(1 - e^{-t/\tau i}) \quad (16)$$

using the following conversions:

$C\infty = K\gamma\infty + a$      (17)

$Ci = K\gamma i$      (18)

$Cs = K\gamma\infty + a + K\Sigma\gamma i$      (19)

$\tau i = RiCi = \gamma i pi$      (20)

$Ri = pi/K$      (21)

$Rs = ps/K$      (22)

Initially, during step 272 the processing unit 200 determines intermediate parameters $\gamma s$ and $1/ps$.

The parameter $1/ps$ is determined by the slope of the curve after a long time has elapsed.

The parameter $\gamma s$ is determined by extending the slope at the origin.

More precisely, the slope of the curve is determined at various points, for example at instants 32 ms, 96 ms and 720 ms and the relative slope values are compared.

If all three slope values are equal, they indicate that in the frequency domain above $\frac{1}{2}\pi 32$ ms $\approx 5$ Hz the capacitor has a conductance behavior equal to $1/ps$.

The parameter $\gamma s$ can be deduced using the relaionship:

$$\gamma s = y_{200} - 200/ps \quad (23)$$

in which $1/ps$ is the slope at the 200-th point $y_{200}$ is the measure voltage at the 200-th point.

If the first slope (at 32 ms) is different from the last two slopes (96 ms, 720 ms) and the last two slopes are equal, the processing unit 200 deems that the conductance behavior of the capacitor is determined by the slope at instant 96 ms, i.e. above a frequency of $\frac{1}{2}\pi 96$ ms $\approx 1.6$ Hz.

The parameter $\gamma s$ is then determined on the basis of a relationship equivalent to equation (23).

However, if all three slopes are different, they indicate the presence of a relaxation phenomenon which changes over long periods of time.

Secondly, during step 273, the processing unit 200 determines intermediate parameter $\gamma\infty$.

In theory the parameter $\gamma\infty$ corresponds to the first stored value. However, this point is distorted by error due to uncertainty on the sampling instant at the beginning of the response, and also on the value of the first stored point.

For this reason, and in accordance with the invention, the parameter $\gamma\infty$ is determined by extrapolation from the second and third stored points.

More precisely, and in accordance with the invention, the slope between the 2nd and 3rd points is extended to the X axis:

$$t2 - 3\delta T/2 \quad (3)$$

where: t2 represents the sampling instant of the 2nd stored point and $\delta T$ represents the sampling intervals.

Equation (20) is drawn from the following reasoning:

The instant $t'0$ of the true origin of the response is unknown. It may be equal to $t2 - \delta T$ where the first point is sampled at the ideal instant, or it may be equal to $t2 - 2\delta T$ in the opposite extreme case, which means that the average time origin is at:

$$t0 = t2 - (3/2)\delta T$$

The Applicant has determined that the error on the determination of the parameter $\gamma\infty$ due to the above-mentioned process, an error which is due both to uncertainty on the real time origin in the interval $t2 - 2\delta T \leq t'0 \leq t2 - \delta T$, and also due to uncertainty concerning the amplitude, is, in fact, negligible.

Thirdly, during step 274, the processing unit 200 determines the intermediate parameters $1/pi$ and $\gamma i$.

When considering a single relaxation domain, the intermediate parameter $1/pi$ is in theory obtained by subtracting the conductivity term $1/ps$ from the initial slope since the initial slope is equal to $1/ps + 1/pi$. The intermediate parameter $\gamma i$ is then obtained from the relationship $\epsilon i = \gamma s - \gamma\infty$.

When there is a plurality of separate relaxation domains, the terms $1/pi$ and $\tau i$ are determined on the basis of slope analysis:

$$\lambda(t) = \sum_{i=1}^{n} \frac{1}{Ri} e^{-t/\tau i} \text{ and } \lambda'(t),$$

as mentioned above with reference to FIGS. 4 and 5. The term $\gamma i$ is then deduced from equation (20) $\tau i = -pi.\gamma i$.

In practice advantage is taken from the fact that the points in each range are separated by a regular time interval or sampling interval.

Instead of determining the slope $\lambda(t)$ the difference is merely taken between two data measurements to obtain the curve $\mu(t) = \delta T.\lambda(t)$ which curve is proportional to the slope $\lambda(t)$.

The relaxation times $\tau i$ are then calculated by detecting the maxima in the curve $\mu'(\log t)$.

However, in order to avoid calculating the logarithms which would take too long, the difference is merely taken between the Y axis values of the curve $\mu(t)$ having X axis value ta and tb which are at a constant ratio K, which may be selected to be equal to 2, for example. This thus provides the slope of the curve $\mu'(\log t)$ at the point which is the geometric mean of the two instants ta and tb used in the calculations:

Calculations are performed by taking ta as being successively equal to instants t1, t2, t3 ... ti and associating each ta with respective instants tb which are t2, t4, t6 ... t2i up to the last available instant in the range.

The slopes taken in each range thus correspond to time $n\sqrt{2\delta T}$.

On this basis, the relaxation time $\tau j$ of each active branch of the Foster model is determined by detecting the X axis value of the maxima in the curve $\mu'(\log t)$.

The X axis values tj and tj+1 of the minima on either side of $\tau j$ are also noted. These instants correspond to the presence of steps in the curve $\mu(t)$ as can be seen by comparing FIGS. 4 and 5.

The processing unit 200 then detects the Y axis values $\mu(tj)$ and $\mu(tj+1)$ of the curve $\mu(t)$ at instants tj and tj+1. The difference between these Y axis values $(\mu(tj+1) - \mu(tj))$ directly gives the value $1/\tau i$ and thus the value $\tau i$.

It has been explained above (under the heading Measuring Theory) that the repetitive response to each stimulating pulse is identical to the beginning of the response to a single step up to end of the duration of the pulse, and to within a correction factor of $1/(1+e^{-T/\tau i})$ which is equal to unity for $\tau i \ll T$.

Insofar as the three acquisition ranges overlap, the data need not be used beyond equivalent time instants equal to 0.5T.

The above-mentioned correction factor is thus very close to unity and the corresponding correction process may be ignored.

Finally, as mentioned above with respect to step 275, the processing unit 200 determines the real parameters on the basis of the above-mentioned intermediate parameters using relationships (17) to (22).

The intermediate parameters are converted to real parameters on the basis of the following reasoning.

The output signal from the measuring unit 300 obeys the relationship:

$$v'(t) = \frac{V \cdot G \cdot Cx(t)}{Cr} - H \quad (24)$$

in which V represents the amplitude of the exciting pulse, G represents the gain of the system, and H represents a constant which is essentially governed by the zeroing apparatus connected to the terminals of the reference capacitor.

From equation (24) to can be deduced that $$Cx(t) = Kv'(t) + H' = K(v'(t) + H'/K) \quad (25)$$

where $K = Cr/VG$ and $H' = KH$.

The values K and H' are originally measured by means of two reference capacitors and thereafter these values are stored.

The intermediate parameters are then transformed into real parameters using equations (17) to (22) and using the stored coefficient K plus a coefficient a which is related to the factor H' by the equation $a = H'/K$ such that $$C(t) = K(y(t) + a) \quad (26)$$

Finally, at step 276, the processing unit 200 classifies the capacitors.

The purpose of this classification is to detect whether the capacitors meet or do not meet standards laid down for a particular production run, and thus serves to monitor manufacturing quality. In order to classify the capacitors, the real parameters $C\infty mes$, Csmes and Rmes are compared with ideal parameters $C\infty th$, Csth and Rth which are stored in memory during the initialization step 210.

If the difference between a real parameter and the corresponding ideal parameter remains within a stored permissible difference, a "pass" signal is generated.

In practice, the permissible difference or tolerance which is stored at step 210 is a percentage ($\pm x\%$) of the nominal value Cn.

The processing unit then performs the subtraction:

$$|C\infty mes - C\infty th| - (xCn)/100. \quad (27)$$

If the difference (27) is positive the value $C\infty$ is out of tolerance and the processing unit 200 generates a signal indicating that the capacitor Cx has failed.

However, if the difference (27) is less than or equal to zero the capacitance is within the required tolerance and the processing unit 200 generates a "pass" signal indicating that the capacitor is acceptable in relation to the parameter $C\infty$.

The processing unit 200 then proceeds similarly with respect to the parameters Cs and Ri.

The results of these three classification procedures relating to the three parameters are stored in memory.

The stored signals may be used for controlling the robot 800 which then operates as a sorting machine.

The sorting may be based on all three parameters passing the tolerance tests, or it may take account of the values of each of the three parameters separately.

Naturally, the present invention is not limited to the above-described embodiment but extends to any variant within the scope of the claims.

Thus, for example, at step 274 there is no need to determine the slope $\lambda(t)$ in order to evaluate the parameters $1/pi$ and Ci.

In order to do this the following sequences are used:

$$C1(t) = C(t) - t/Rs \quad (28)$$

-continued $$\frac{dC1}{du} = \frac{dC1}{dt} \times \frac{dt}{du} = t \sum_i \frac{1}{Ci\tau i} e^{-t/\tau i} \quad (29)$$

$$\frac{d^2C}{du^2} = -t \sum_i \left[ \frac{1}{Ci\tau i} e^{-t/\tau i} \left( \frac{t}{\tau i} - 1 \right) \right] \quad (30)$$

If the exponential components are separated, extreme values are observed for $t \approx \tau i$.

The processing algorithm at step 274 then begins by eliminating the "final slope" term $t/rs$, and then seeks minima in the function $(dC1/du)$. These minima provide instants $tj = \tau j = Rj \cdot Cj$.

Finally, by reinserting the above-mentioned instants $tj$ into the function (28) $C1(t)$ the quantities:

$$C1(tj) = \frac{1-e}{e} Cj + \sum_i^{j-1} Ci \quad (31)$$

are obtained.

The processing unit 200 may be constituted, for example, by a microcompressor card of the ECB85 type sold by the Siemens Company. This card uses an 8085 microprocessor, two parallel input/output ports of the 8185 type, 1K bytes of static read only memory (RAM), a monitor program, and an 8279 type circuit providing an interface with the keyboard 600.

We claim:

1. A method of testing capacitors and dielectric materials, wherein the method comprises the following steps:
   (i) inserting the item to be tested in series with a reference impedance in a measuring chain;
   (ii) applying repetitive stimulating voltage pulses to the measuring chain;
   (iii) zeroing the voltage at the terminals of the reference impedance during each inactive half-cycle of the stimulating pulses;
   (iv) sampling the response obtained at the terminals of the reference impedance for each stimulating pulse at time instants which are progressively shifted relative to the beginning of the stimulating pulses; and
   (v) analyzing the samples to deduce parameters of the element under test in accordance with a Foster model comprising a plurality of main parallel connected branches, each of which is constituted by a resistance and a capacitance connected in series, together with two auxiliary branches which are likewise connected in parallel and are respectively constituted by a pure capacitance and by a pure resistance wherein the value of said resistances and capacitances of the Foster model represent said parameters.

2. A test method according to claim 1, wherein the reference impedance (Cr) is a capacitor.

3. A test method according to claim 2, wherein the reference capacitor (Cr) has a capacitance which is about 1000 times great than the capacitance of the item under test.

4. A test method according to claim 1, wherein steps (ii) and (iv) in which repetitive stimulating pulses are applied and in which sampling takes place are organized as a plurality of bursts of pulses with the periods of the pulses increasing from one burst to the next.

5. A test method according to claim 4, wherein the steps (ii) and (iv) successively comprise:
   applying a first series of stimulating pulses of constant period together with a series of sampling pulses of constant period which period is slightly greater than the period of the stimulating pulses;
   applying a second series of stimulating pulses of constant period which period is substantially greater than the period of the stimulating pulses of the first series, together with a second series of sampling pulses of constant period which period is slightly greater than a sub-multiple of the period of the stimulating pulses; and
   applying a single stimulating pulse of long duration together with sampling pulses at progressively increasing intervals.

6. A test method according to claim 5, wherein the period of the stimulating pulses of the first series is about 200 μs, the period of the stimulating pulses of the second series is about 2 ms, and the last stimulating pulse having a duration greater than 700 ms.

7. A test method according to claim 1, wherein during at least one portion of step (iv) the time slip between two consecutive sampling pulses, relative to the stimulating pulses is about 0.2 μs.

8. A test method according to claim 1, wherein the duty ratio of the stimulating pulses is about ½.

9. A test method according to claim 1, wherein analysis step (v) comprises:
   (va) taking the final slope of the response as being representative of the parameter $1/Rs$ of the Foster model with said parameter $1/Rs$ being representative of the inverse of the value of the pure resistance of one of said auxiliary branches of the Foster model; and
   (vb) taking the initial asymptotic value of the response as being representative of the parameter Cs of the Foster model, with said parameter Cs being representative of the sum of the capacitances of the Foster model.

10. A test method according to claim 9, wherein step (va) consists in comparing the slope of the response at different instants and in taking as the value of the final slope the value of the slope at a plurality of successive instants when the value at said successive instants is considered as being equal; and
    step (vb) consists in determining the initial asymptotic value by subtracting the product of the final slope and the X axis value of the n-th sample from the value of the n-th sample.

11. A test method according to claim 1, wherein step (v) includes step (vc) of taking the initial value of the response as being representative of the parameter $C\infty$ of the Foster model, with said parameter $C\infty$ being representative of the pure capacitance of one of said auxiliary branches of the Foster model.

12. A test method according to claim 11, wherein step (vc) consists in determining the initial value of the response by extrapolating from the second and third samples and taking the average time origin $t0$ as being equal to $$t0 = t2 - (3\delta T/2)$$

in which t2 represents the instant at which the second sample is acquired; and $\delta T$ represents the sampling interval.

13. A test method according to claim 1, wherein step (v) includes:
   (vd) taking the amplitude of the steps in the curve of the slope of the response as being representative of the parameters 1/Ri of the Foster model, with said parameter 1/Ri being representative of the inverse of the values of the resistances of the main branches; and
   (ve) taking the X axis values of the maxima in the derivative of the slope of the response as being representative of the relaxation time of the various main branches of the Foster model.

14. A test method according to claim 1, wherein analysis step (v) includes the step of converting the parameters y(t) determined on the basis of the samples to obtain parameters relating to capacitance using the linear relationship: $C(t) = K(y(t) + a)$, in which K and a are constants.

15. A test method according to claim 14, including a preliminary step consisting in:
   disposing two reference capacitors Cr1 and Cr2 in series in the measuring chain;
   in detecting the response v'(t) to a single stimulation step of amplitude V such that $$v' = (VGCr1/Cr2) - a$$

in which G represents the gain of the system and a represents an additive constant due to the measuring chain being zeroed; and
   wherein the processing step (v) further includes a step consisting in correcting the measured values y(t) on the basis of the coefficients G and a in order to obtain capacitance parameters C(t) in accordance with the Foster model and using the equation:

$$C(t) = K(y(t) + a).$$

16. A test method according to claim 1, including a subsequent step of classifying the tested items on the basis of the parameters determined from the samples.

17. A test method according to claim 1, further including the steps of taking a reference sample $Y_{nr}$ for each stimulating pulse at an instant r which is constant relative to said pulses and in correcting each sample $Y_{nm}$ prior to analysis step (v) on the basis of the relationship
   $Y'_{nm} = Y_{nm} - (Y_{nr} - Y_{1r})$ in which
   $Y_{nr}$ represents the reference sample taken during the n-th stimulating pulse; and $Y_{1r}$ represents the reference sample taken during the first stimulating pulse.

18. A test method according to claim 1, wherein the stimulating pulses are generated from the beginning of each test process with a time delay relative to the sampling pulses, and wherein only those samples having non-zero values are taken into consideration.

19. Apparatus for testing capacitors and dielectric materials, said apparatus comprising:
   a measuring unit suitable for receiving an item to be tested in series with a reference impedance in a measuring chain;
   a clock suitable for applying repetitive stimulating voltage pulses to the measuring chain;
   means adapted to reset the voltage at the terminals of the reference impedance to zero during each inactive half-cycle of the stimulating pulses;
   a sampling unit sensitive to the response obtained at the terminals of the reference impedance during each stimulating pulse, and which samples said response at instants which are progressively shifted relative to the beginning of the stimulating pulses; and
   a processing unit which analyzes the samples taken by the sampling unit to deduce parameters of the tested item in accordance with a Foster model comprising a plurality of main parallel connected branches, each of which is constituted by a resistance and a capacitance connected in series, together with two auxiliary branches which are likewise connected in parallel and are respectively constituted by a pure capacitance and by a pure resistance wherein the value of said resistances and capacitances of the Foster model represent said parameters.

20. Test apparatus according to claim 19, wherein the reference impedance is a capacitor.

21. Test apparatus according to claim 20, wherein reference capacitor has a capacitance which is about 1000 times greater than the capacitance of the item under test.

22. Test apparatus according to claim 19, wherein the measuring unit includes means enabling the reference impedance inserted in the measuring chain to be modified.

23. Test apparatus according to claim 19, wherein the sampling unit includes an analog-to-digital converter.

24. Test apparatus according to claim 19, wherein the processing unit controls the clock in such a manner that the clock generates a plurality of successive bursts of stimulating pulses having periods which increase from one burst to the next.

25. Test apparatus according to claim 19, wherein the clock successively generates:
   a first burst of stimulating pulses of constant period together with a series of sampling pulses of constant period which period is slightly greater than the period of the stimulating pulses;
   a second burst of stimulating pulses of constant period which period is substantially greater than the period of the stimulating pulses of the first burst, together with a second burst of sampling pulses of constant period which period is slightly greater than a sub-multiple of the period of the stimulating pulses; and then
   a single stimulating pulse of long duration together with sampling pulses at progressively increasing intervals.

26. Test apparatus according to claim 25, wherein the period of the stimulating pulses of the first burst is about 200 μs, the period of the stimulating pulses of the second burst is about 2 ms, and the last stimulating pulse has a duration of greater than 700 ms.

27. Test apparatus according to claim 19, wherein the clock comprises:
   a master oscillator;
   a plurality of frequency dividers driven by the master oscillator and generating stimulating pulses of various periods;
   AND gates connected to the outputs of the dividers and selectively enabled by the processing unit;
   an OR gate whose inputs are connected to respective outputs from said AND gates and whose output provides said stimulating pulses.

28. Test apparatus according to claim 27, further including:

a second series of frequency dividers driven by the master oscillator and generating sampling pulses at various periods;

a second series of AND gates connected to respective outputs from the second series of frequency dividers and selectively enabled by the processing unit synchronously with an associated one of the AND gates of the first series of AND gates; and a second OR gate whose inputs are connected to the outputs of the second series of AND gates and whose output provides the sampling pulses.

29. Test apparatus according to claim 19, wherein the clock also generates auxiliary sampling pulses at a constant instant in each stimulating pulse, for the purpose of taking reference samples.

30. Test apparatus according to claim 19, wherein the measuring unit includes, in succession between the measuring chain and the sampling unit, a decoupling stage having very high input impedance and at least one amplifier stage.

31. Test apparatus according to claim 30, wherein the connection between the measuring chain and the decoupling stage is screened.

32. Test apparatus according to claim 19, wherein the means for resetting the voltage at the terminals of the reference impedance to zero have very high output impedance.

33. Test apparatus according to claim 32, wherein the means for resetting the voltage to zero include a field effect transistor.

34. Test apparatus according to claim 19, wherein the sampling unit includes in cascade: a sample-and-hold circuit, an amplifier stage, and an analog-to-digital converter.

35. Test apparatus according to claim 34, wherein the sample-and-hold circuit holds data at its output for a period of not less than 25 µs.

36. Test apparatus according to claim 34 or 35, wherein the sampling unit includes two similar parallel chains, one for measurement samples and the other for reference samples, each of said chains comprising in cascade: a sample-and-hold circuit, an amplifier stage, and an analog-to-digital converter.

37. A test method according to claim 1, further including a step prior to processing the measurement data, in which the measurement data is smoothed using a moving means method.

* * * * *